United States Patent
Rabel et al.

(10) Patent No.: US 6,564,158 B1
(45) Date of Patent: May 13, 2003

(54) BROADBAND ELECTROMAGNETIC FIELD COMPONENT MEASUREMENT SYSTEM

(75) Inventors: Jay A. Rabel, Shorewood, MN (US); Steven R. Stadler, Shoreview, MN (US)

(73) Assignee: Holaday Industries, Inc., Eden Prairie, MN (US)

(*) Notice: Subject to any disclaimer, the term of this patent is extended or adjusted under 35 U.S.C. 154(b) by 148 days.

(21) Appl. No.: 09/640,574

(22) Filed: Aug. 17, 2000

(51) Int. Cl.[7] .............................................. G01R 35/00
(52) U.S. Cl. ......................... 702/57; 702/64; 702/86; 702/104; 702/107; 702/115; 702/92
(58) Field of Search ........................ 702/38, 57, 64–66, 702/85, 86, 91, 104, 105, 107, 108, 109, 115, 124, 92, 122, 126, 93, 183, 188, 189, FOR 103–FOR 104, FOR 106, FOR 110, FOR 134, FOR 156–FOR 163, FOR 165, FOR 170–FOR 171, FOR 173; 324/202, 225, 224–247, 207.11; 33/355 R, 356, 357

(56) References Cited

U.S. PATENT DOCUMENTS

| | | | | |
|---|---|---|---|---|
| 4,780,910 A | * | 10/1988 | Huddleston et al. | 324/116 |
| 5,085,427 A | * | 2/1992 | Finn | 248/441.1 |
| 5,300,885 A | * | 4/1994 | Bull | 324/247 |
| 5,357,253 A | * | 10/1994 | Van Etten et al. | 324/337 |
| 5,762,064 A | * | 6/1998 | Polvani | 128/899 |
| 5,764,058 A | * | 6/1998 | Itskovich et al. | 324/303 |
| 5,910,905 A | * | 6/1999 | Qian et al. | 708/311 |
| 5,990,679 A | * | 11/1999 | Frommer et al. | 324/244 |
| 6,008,641 A | * | 12/1999 | Penfold et al. | 324/225 |
| 6,161,032 A | * | 12/2000 | Acker | 600/424 |
| 6,230,105 B1 | * | 5/2001 | Harris et al. | 324/72 |
| 6,335,617 B1 | * | 1/2002 | Osadchy et al. | 324/202 |

* cited by examiner

Primary Examiner—Marc S. Hoff
Assistant Examiner—Carol S Tsai
(74) Attorney, Agent, or Firm—Faegre & Benson, LLP

(57) ABSTRACT

Apparatus and method having a probe and readout for taking electromagnetic field measurements by acquiring raw data and linearizing the data either during processing or after processing by using a curve-fitting equation to non-linearly interpolate between calibration data points. A curve-fitting equation of the form $V/m = a + bx^c$ is used for selected segments of the data and the invention requires only the retention of numerical values for the coefficients a, b, and c for each data segment. The coefficient values are stored in the probe and used either by the probe or the readout to construct calibrated data in volts per meter (V/m).

14 Claims, 15 Drawing Sheets

Fig. 7

| FIG 7A | FIG 7D |
| --- | --- |
| FIG 7B | FIG 7F |
| FIG 7C | FIG 7G |
| FIG 7E | FIG 7H |

BROADBAND ELECTROMAGNETIC FIELD COMPONENT MEASUREMENT SYSTEM

PURPOSE AND ADVANTAGES OF INVENTION

The purpose of this invention is to provide an improved isotropic broadband measurement of a component of an electromagnetic field. Prior art broadband field measurement system speed and accuracy were limited by existing functional partitioning and circuit architecture. The present invention establishes a faster, more flexible, and more accurate measurement method by improving the overall system functional partitioning, circuit architecture and includes a new calibration approach.

The present invention removes measurement bottlenecks allowing substantially faster field measurement.

The present invention uses data collection and compensation techniques that can be tailored to meet a large variety of measurement conditions and requirements. Measurement accuracy is improved over a very broad dynamic range.

The present invention introduces a highly efficient, accurate and flexible calibration technique. The calibration technique supports a large variety of system data compensation applications and requires very little Probe memory.

BACKGROUND OF THE INVENTION

A common method of measuring data of an electromagnetic field is based on measuring the electric field component. Referring to FIG. 1, a typical prior art detector-based radio frequency and microwave electric field measurement system 20 contained three primary functional subsystems: (i) a sensing subsystem 22, (ii) a signal conditioning and processing subsystem 24, and (iii) a control and display subsystem 26. These subsystems and the functions performed within them as were commonly partitioned in the prior art are as shown in FIG. 1. Physically, the sensing subsystem 22 and signal conditioning and processing subsystem 24 were often contained within an electric field probe 28 which, in operation is exposed to the environment in which the field is to be measured. The control and display subsystem 26 was contained within a system readout 30 which, in operation is preferably remote from the probe to avoid or reduce perturbation of the field to be measured.

The sensing subsystem 22 included sampling of the incident electric field using a band-limited transducer or antenna for a transducing function 32 followed by a detection function 34 using a diode or thermocouple based circuit. The sensing subsystem 22 included additional filtering components for rf band-shaping and/or noise reduction in a frequency band-shaping function 36. The amplitude of the detection circuit output voltage was coupled into the instrumentation electronics part 24 of the system 20.

Functions performed in the signal conditioning and processing subsystem included: analog signal conditioning such as a filtering function 38 and a level-adjust function 40, conversion of the analog level to digital form in an A/D conversion function 42, and a data communication function 44 to and from the control and display subsystem 26. Measurement compensation in the signal conditioning and processing subsystem 24 included a sensor linearity correction function 46, a temperature compensation function 52 (if required), a signal averaging or data smoothing function 50, and calculation of the electric field amplitude in a composite field calculation function 48. It is important to understand that the data sent from the signal conditioning and processing subsystem 24 to the control and display subsystem 28 typically contained calibrated measured data in common units such as volts per meter (V/m).

The control and display subsystem 26 typically contained a data display function 54 for visual review of instrument state and measured data, a ranging/zero control function 56 for adjusting ranging and zeroing, and sometimes included data logging function 58 along with a user interface function 60 and a data I/O interface function 62 for data exchange between the sensing and display subsystems 22–26, and between the display subsystem 26 and an external data collection system (not shown here). In the operation of prior art system 20, the user, through the system readout 30, requested and read calibrated field intensity data from the electric field probe part, either for a single axis, or for the vector sum of the three axes readings.

Because of the functional partitioning and circuit architectures used, there were some inherent performance limitations associated with such prior art systems as follows:

1. Performing data compensation functions such as linearity and temperature correction in the probe often required additional circuitry for data compensation and added to the micro-controller processing requirements. Adding circuitry increased the physical volume of the sensing subsystem. Furthermore, additional processing slowed down the measurement response time.

2. Calculating the field intensity in the instrumentation electronics of the signal conditioning and processing subsystem also required additional processing time, again slowing down measurement response times. For 3-axis sensors, the field calculation had to be completed for each sensor axis and then the electric field was calculated as a vector sum of the individual field values.

3. Obtaining individual field readings for each of the three measurement axes usually required multiple reading requests from the system. This increased total measurement time and/or introduced inaccuracies when measuring time-varying fields since the individual axis readings were usually not simultaneous.

Common linearity correction techniques included using analog diode voltage compensation and piece-wise linear approximation lookup tables. Analog corrections offered advantages of minimal measurement time impact, but were relatively inaccurate compared to digital techniques. Also, such prior art approaches usually performed well only over relatively narrow dynamic ranges. Beyond those ranges, measurement inaccuracy increased quickly. The additional circuitry required also increased the physical volume required to contain the electronics. Increased circuit volume created a larger cross-section instrumentation electronics enclosure, which perturbed the measured field more and consequently decreased accuracy of measurement at higher frequencies.

The lookup-table method involved characterization of the detector performance at discrete electric field levels during the calibration process. A table of corrected field readings was typically stored in electronic memory. When a measurement was made the detector output voltage was compared to the available correction points and a piece-wise linear interpolation was made to find the compensated electric field reading. Accuracy was limited by the lookup table point resolution, the linear interpolation error, and the numeric precision used to store and calculate the results. The time required to perform the compensation added to the total time required for such a prior art probe to perform a measurement.

The present invention has improvements over the prior art by providing a faster and smaller probe exposed to the field, and provides faster and simpler data acquisition through the process of transmitting uncalibrated data (hereinafter "Raw Data") from an improved probe (hereinafter "Probe") to an improved system readout (hereinafter "Readout"), while enabling the Readout to calibrate the Raw Data by an improved method that calibrates and linearizes the electromagnetic field data with improved accuracy and reduced electronic storage requirements. The improved system has the capability of operating with a variety of Readout configurations and in one or more modes selectable by a user, giving greater flexibility than was available in the prior art.

BRIEF DESCRIPTION OF THE DRAWINGS

FIG. 7 is a key to FIGS. 7A, 7B, 7C, 7D, 7E, 7F, 7G, and 7H.

DESCRIPTION OF INVENTION

System Overview

The present invention includes an isotropic electromagnetic field probe (Probe) and an isotropic electromagnetic field measurement interface software (Interface Software). The Interface Software is intended to be installed on a "host system" which may be a Readout subsystem or personal computer. The Probe includes an electronic field measurement subsystem which provides "Raw Data" to Interface Software in the Readout subsystem. The Interface Software processes the Raw Data into calibrated field level readings that are presented to a user through the host system.

Figure 1:
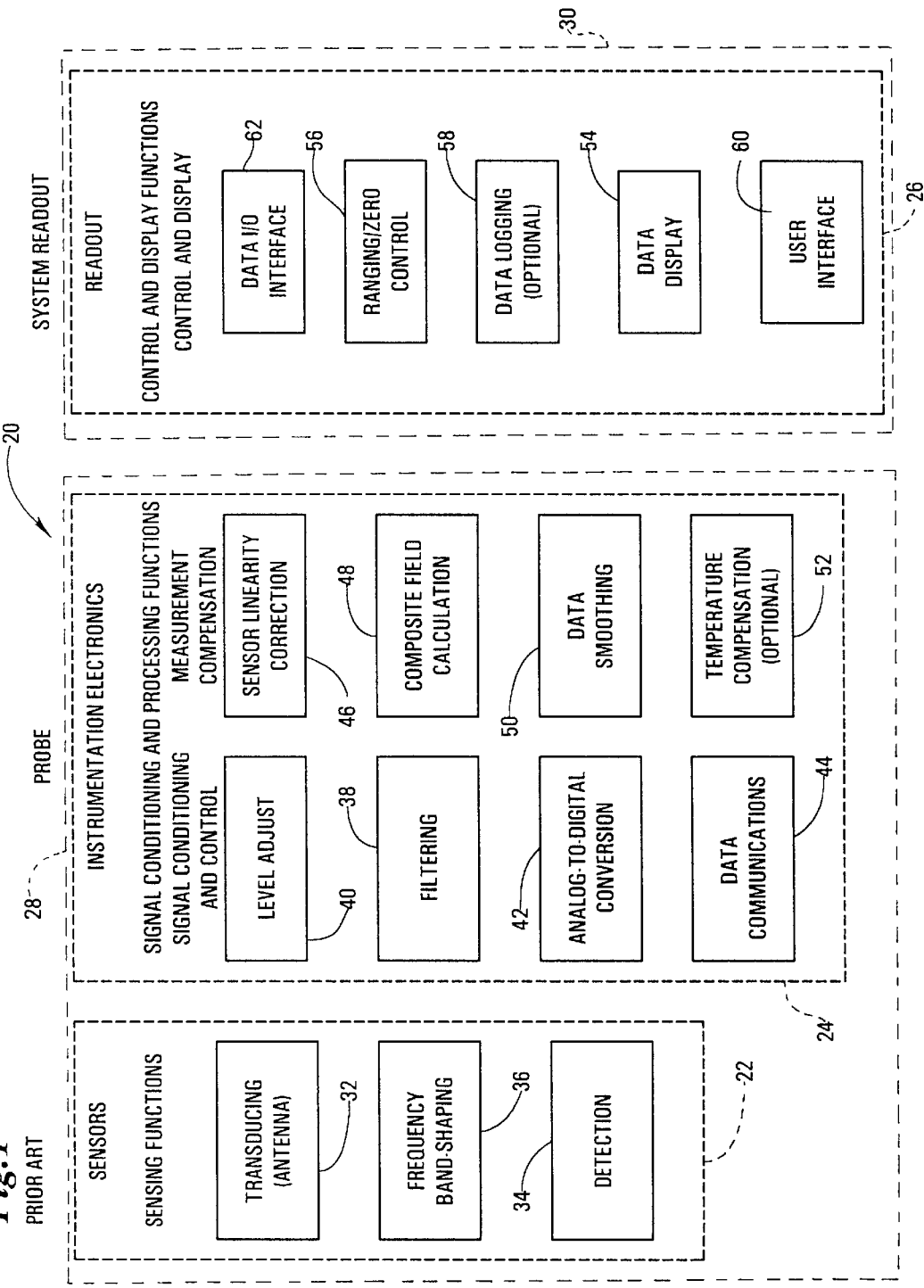
FIG. 1 is a table showing the functional partitioning of a prior art system for measuring electromagnetic field data.
Figure 2:
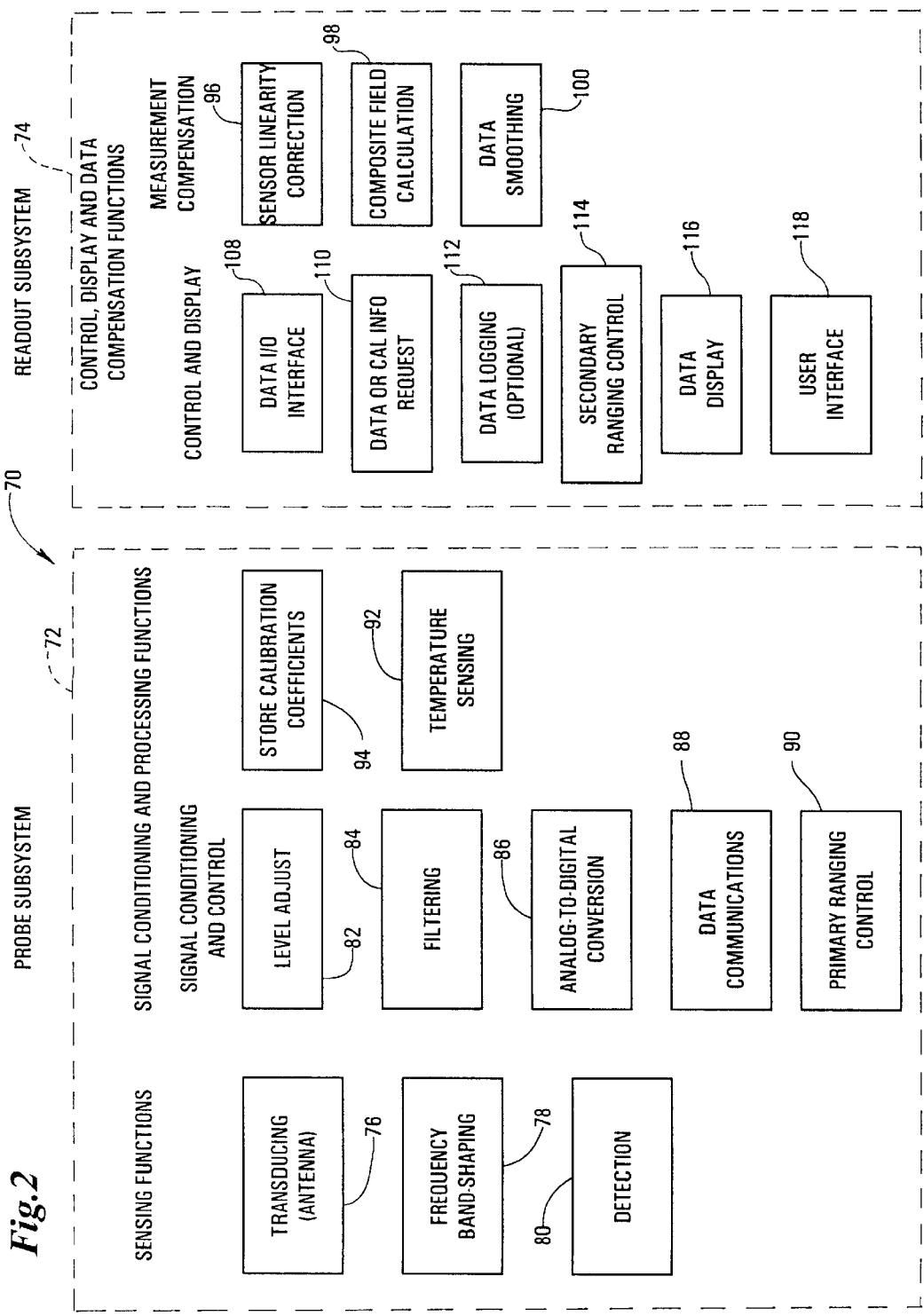
FIG. 2 is a table showing the functional partitioning of the present invention.

The overall functional partitioning and the functions performed within each subsystem of the present invention are shown in FIG. 2. The system 70 of the present invention has a Probe subsystem 72 and a Readout subsystem 74. The circuit and system architectures of the present invention provide that sensor linearity correction, composite field calculation, measured value averaging and primary ranging control are carried out in the Readout subsystem 74, rather than in the Probe subsystem 72.

Functional Partitioning of Probe and Readout Subsystems

A functional partitioning diagram of the Probe subsystem 72 shown in FIG. 2 includes a transducing function 76, a frequency band-shaping function 78, and a detection function 80, all in a sensing part of the Probe subsystem 72. In addition, the Probe subsystem has a signal conditioning and processing part which includes a level adjust function 82, a filtering function 84, an analog-to-digital conversion function 86, a data communications function 88, and a primary ranging control function 90. Furthermore, subsystem 72 also includes a temperature sensing function 92, and, most importantly, a function 94 to store calibration coefficients.

As can be seen in FIG. 2, the measurement compensation functions reside in the Readout subsystem 74 for the present invention. Specifically, the Readout subsystem 74 of the present invention includes a sensor linearity correction function 96, a composite field calculation function 98, and a data smoothing function 100.

The Readout subsystem 74 also includes a data I/O interface function 108, a data or calibration information request function 110, an optional data logging function 112, a secondary ranging control function 114, a data display function 116, and a user interface function 118.

Block Diagram

Figure 3:
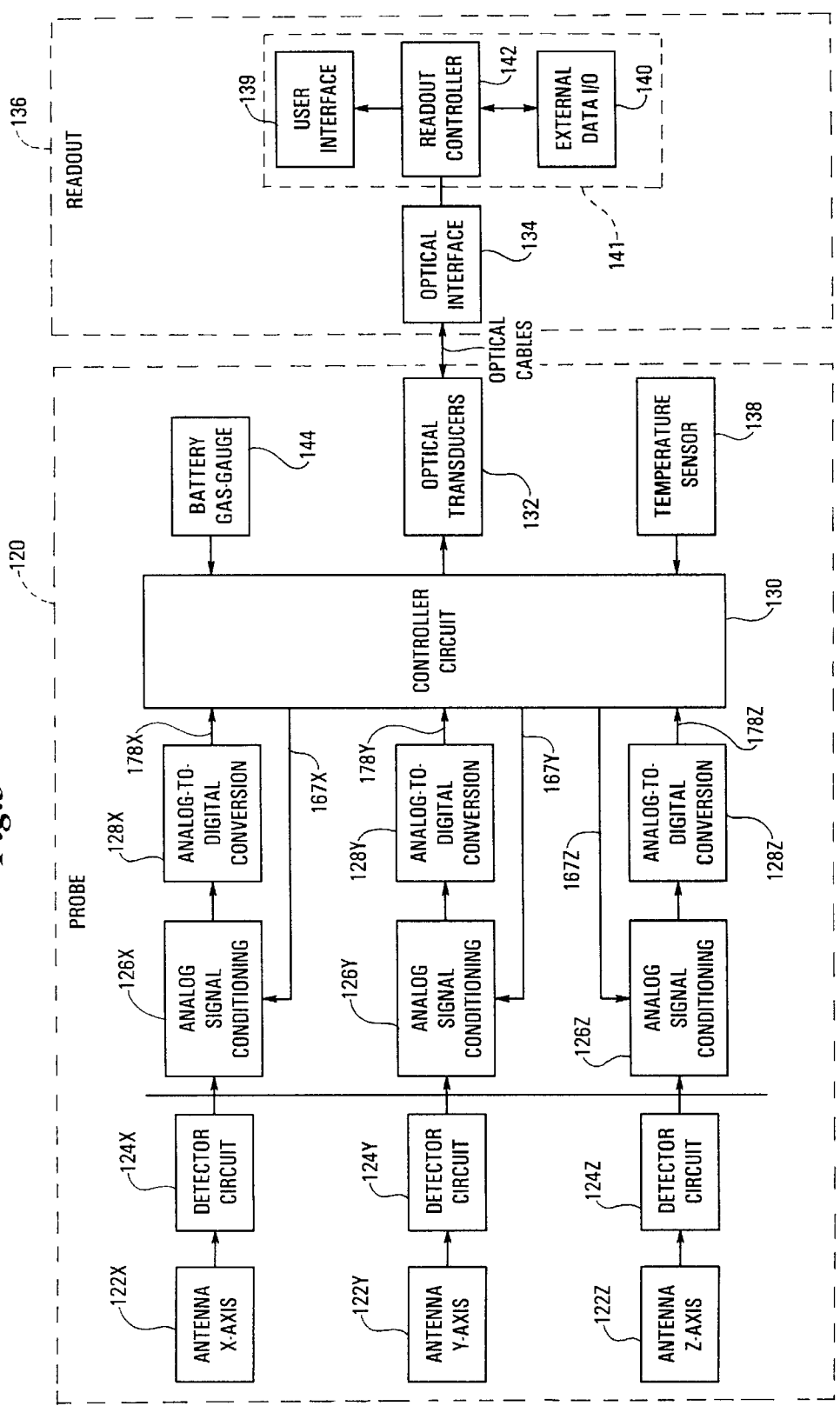
FIG. 3 is a block diagram of the present invention.

A block diagram of the hardware configuration of the Probe and Readout subsystems of the present invention is shown in FIG. 3. The Probe subsystem block diagram 120 illustrates that the Probe measures electric field intensity by using three orthogonal monopole antennas 122X, 122Y and 122Z, attached to three preferably identical individual detector circuits 124X, 124Y, and 124Z, respectively, to independently and simultaneously measure three orthogonal components Ex, Ey and Ez of an incident electric field. The detected voltages are filtered and level-adjusted by respective analog signal conditioning blocks 126X, 126Y, and 126Z, and converted to digital counts by respective analog-to-digital (A/D) converter blocks 128X, 128Y, and 128Z which are processed by a digital controller circuit 130 and optically transmitted by an optical transducer block 132 to an optical interface block 134 of a Readout block diagram 136. In addition to the digital representation of the field measurements (still in uncalibrated form as "Raw Data"), gain-adjust information (from block 130) and temperature information from block 138 (one or both of which may be included in "Raw Data") is desirably transmitted to the Readout subsystem. The Readout subsystem has a user interface block 139, an external data I/O block 140 and a Readout controller block 142 for calculation and display or presentation of incident electric field level, typically in V/m units. It is to be understood that blocks 139, 140 and 142 may reside in a separate "host" system 141, which may be a user's computer, for example.

A battery "gas gauge" block 144 is present in the Probe subsystem block diagram 120 to provide information to the Readout subsystem about the state of charge remaining in a battery in the Probe.

Physical Enclosure

Figure 4:
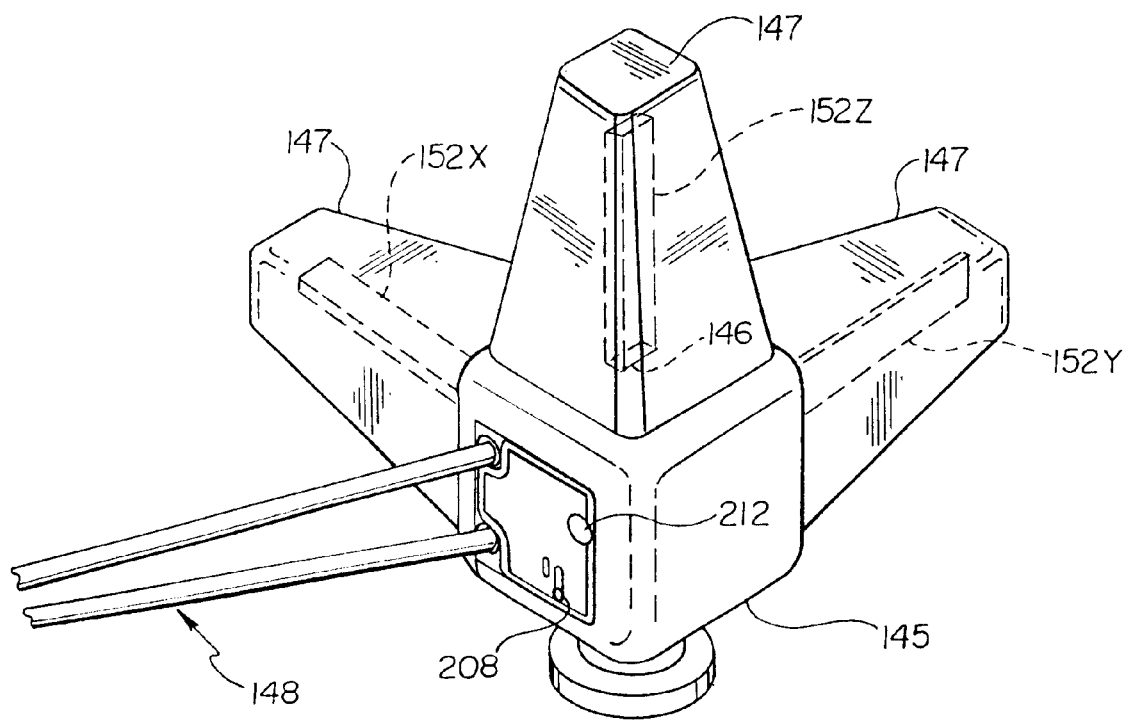
FIG. 4 is a perspective view of a housing for the Probe of the present invention.

Referring now also to FIG. 4, the electronic components (other than the antennae) of the Probe subsystem 72 are encased in a metallic shielding enclosure 145 to provide isolation from electromagnetic field exposure. Three orthogonal monopole antennae 152X, 152Y, and 152Z extend through small slots (such as slot 146 for antenna 152Z) in the shielding enclosure sides to enable sensing of the electric field component of the ambient electromagnetic field. Each antenna is covered by an electromagnetically transparent cover 147 to physically protect the antenna. A pair of fiber optic cables 148 extend from Probe 72 for connection to Readout 74. The preferred fiber optic cable is available from Lucent Specialty Fiber Technologies under part number AC0-3720-10. A battery recharging jack 212 and an ON-OFF power switch 208 also extend through cover 145.

Improved Architecture

With the new architecture of the present invention, the Probe does not need to send out calibrated field level values when making a measurement. Instead the Probe sends out Raw Data made up of uncorrected analog-to-digital counts along with internal gain settings for each separate axis. Because there is no requirement for compensating the data in the instrumentation electronics section of the Probe, less signal processing is required and the necessary operations can be executed much more quickly. The result is much faster measurement response times. In the practice of the present invention, it can thus be seen that Raw Data does not have to be corrected in the Probe to electric field units of Volts per meter, nor does a vector sum need to be performed, as was often the case in the prior art.

It is important to note that the output data stream (Raw Data) contains the independent and simultaneous counts for all three axes. Each individual axis is fully instrumented with its own signal conditioning and analog-to-digital conversion circuitry. The A/D data for each axis is clocked at exactly the same time by the Probe micro-controller ensuring a highly accurate "snapshot" of the electric field being measured at that moment. When measuring modulated or otherwise time-varying electromagnetic fields, this approach provides the highest possible accuracy of the total field.

Probe Circuit Schematic

Referring now most particularly to FIGS. 7 and 7A through 7H, details of the electrical circuit of the Probe subsystem 72 may be seen. Because the details of each axis subcircuit are identical, only one will be described here. In the X-axis subcircuit 150, the Probe subsystem 72 uses a resistively-loaded antenna 152 to sense the electric field being measured. The antenna 152 is integrated directly with a dedicated, individual detection diode and instrumentation electronics in an analog signal conditioning circuit 126. Signal detection is achieved using a Schottky-barrier diode detector 156, available under part number SMS-3922-011 from Alpha Industries. The detector output voltage is buffered and amplified in the analog signal conditioning circuit 126. An rf capacitor 158 available under part number ATC100A101JW150XC from American Technical Ceramics operates to filter the incoming signal. An rf resistor 160 is available under part number RS0402CB2004KN90 from Barry Industries. A second rf resistor 162 is available under part number RS0402CB1004KN90, also from Barry Industries. Operational amplifier 164 is available under part number OPA336N from Burr-Brown. Circuit 126 uses a dual digital potentiometer chip or integrated circuit 166 available under part number DS1868E-100 from Dallas Semiconductor to allow adjustment of operational amplifier offset-voltage and gain levels via control line 167 from a digital micro controller 172 in the circuit of FIG. 7D. The digital microcontroller is available under part number AT90S8515-8AC from Atmel. Control line 167 is a serial port data input line for chip 166, and carries information for both digital potentiometers in chip 166, one of which is used for offset-voltage adjustment on line 168 and the other for gain level setting in the negative feedback loop of amplifier 164 on line 170. It is to be understood that micro-controller 172 includes digital storage memory within it.

After signal conditioning, the signal level for each channel is simultaneously converted to digital form by analog to digital converter circuit 128. Circuit 128 includes a 3.0V precision voltage reference 174 available under part number AD1583ART from Analog Devices. Circuit 128 also includes a 12 bit micro power A/D converter 176 available under part number ADS7822EC from Burr-Brown. The output line 178 delivers the digital representation of the field measurement in uncalibrated form to the controller circuit 130. To ensure that the three orthogonal axis measurements are taken at exactly the same moment, the DCLOCK (data clock) control line 180 for the sample and hold circuitry built into the analog-to-digital converter 176 are wired together across all three axes and clocked by a single microcontroller output on line 180 connected to pin 43 of micro-controller 172. This is especially important to provide accurate field calculation when measuring modulated or otherwise rapidly changing fields.

Referring now again to the operational amplifier 164 and digital potentiometer 166, those two integrated circuits with accompanying components (including a first or "OFFSET" digital potentiometer in integrated circuit 166) form an op-amp offset auto-adjust circuit which injects a voltage to a summing circuit at the input of the op-amp 164. The offset auto-adjust feature allows a software-controlled closed-loop input offset voltage adjustment routine to be executed during calibration of the Probe 72. The software routine is located in the micro-controller 172. Initially, the Probe 72 is placed in a zero electric field chamber. The circuit is set at the highest gain setting to amplify any input offset error that may be present in op-amp 164. The circuit that injects the offset adjustment voltage to the input summing circuit is set to its most negative value. The digital controller reads the A/D converter measuring the op-amp output voltage on line 165. At least 50 consecutive A/D converter readings are taken and the minimum value is stored. If the minimum value is less than 0007, the digital potentiometer setting is incremented and the new setting tested. If the minimum value of the A/D output is greater than 0006, then the offset adjustment voltage is set to the proper value. The value then set into the offset digital potentiometer is saved in non-volatile memory in the micro-controller 172, and restored to the OFFSET potentiometer each time the system is powered up after calibration. This ensures that offset errors in the operational amplifier and analog to digital converter are removed, and further, that the operational amplifier is biased out of a region of non-linear operation at the end of its range. It is to be understood that the same procedure is used for all three axes.

The micro-controller 172 determines the gain of the amplifier circuit based on the current gain setting and the A/D converter reading, using the second or "GAIN-SET" digital potentiometer in IC 166.

1. If the gain is on the highest allowed setting, then the closed-loop auto-gain-control (AGC) will reduce the gain of the amplifier 164 when the reading of the A/D converter 176 exceeds a pre-determined high-threshold value.

2. If the gain is on one of the mid-range settings, the closed-loop AGC will increase the gain of the amplifier circuit when the A/D converter reading is below a pre-determined low-threshold value, or it will reduce the gain of the amplifier when the A/D converter reading exceeds a pre-determined high-threshold value.

3. If the gain is on the lowest allowable setting, then the closed-loop AGC will increase the gain of the amplifier circuit when the A/D converter reading is lower than a predetermined low-threshold value.

Figure 7A:
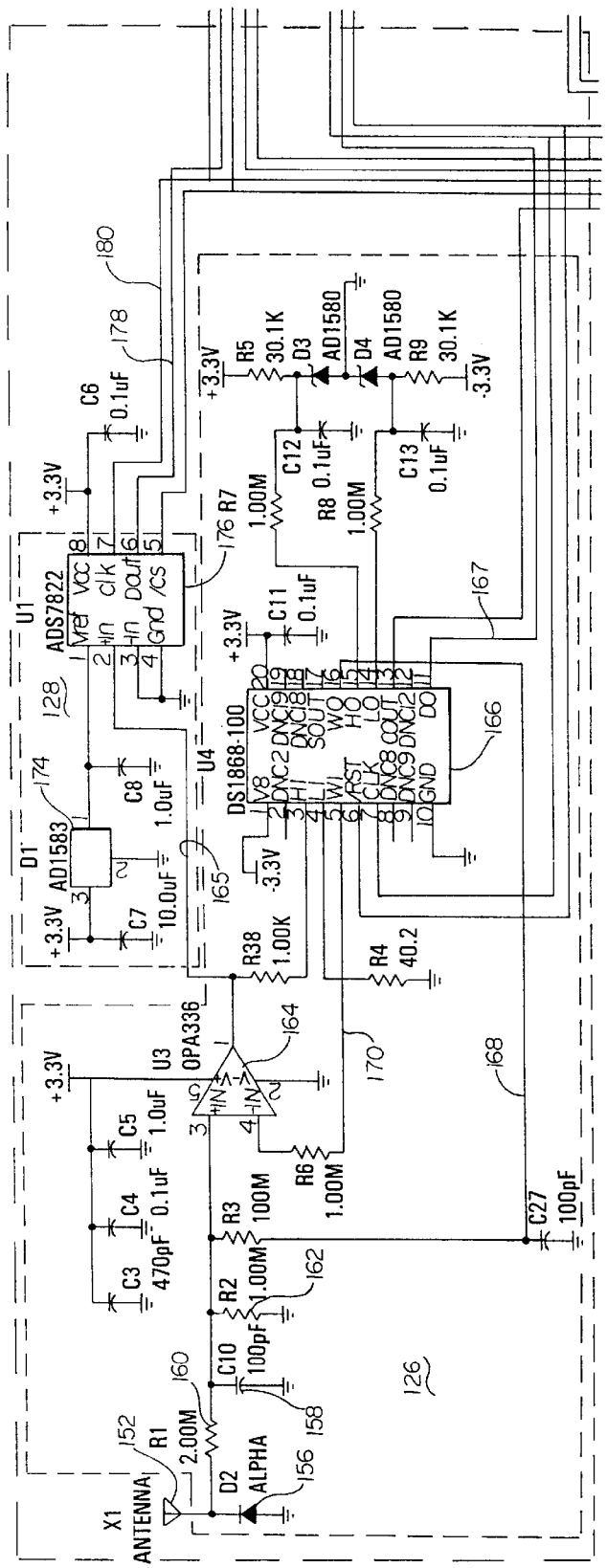
FIG. 7A is a schematic of an X axis subsystem useful in the practice of the present invention.
Figure 7B:
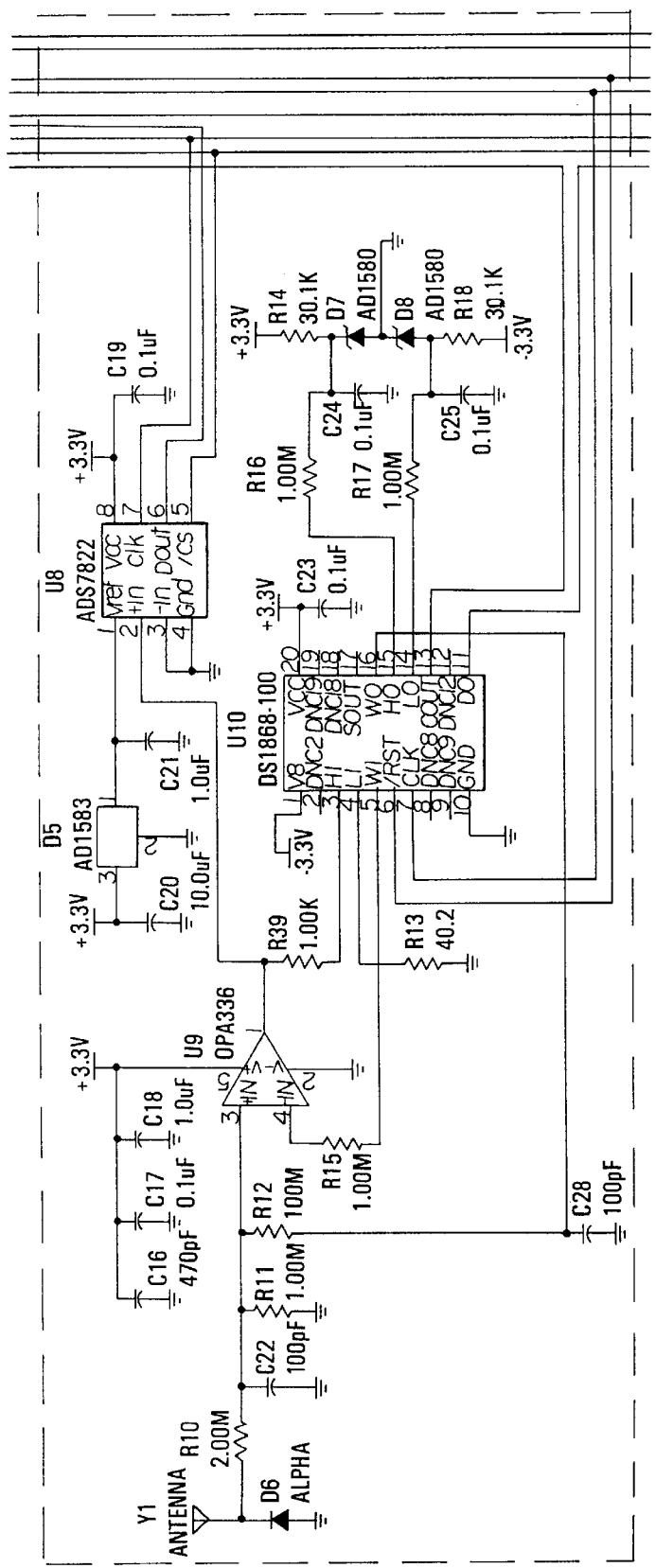
FIG. 7B is a schematic of a Y axis subsystem useful in the practice of the present invention.
Figure 7C:
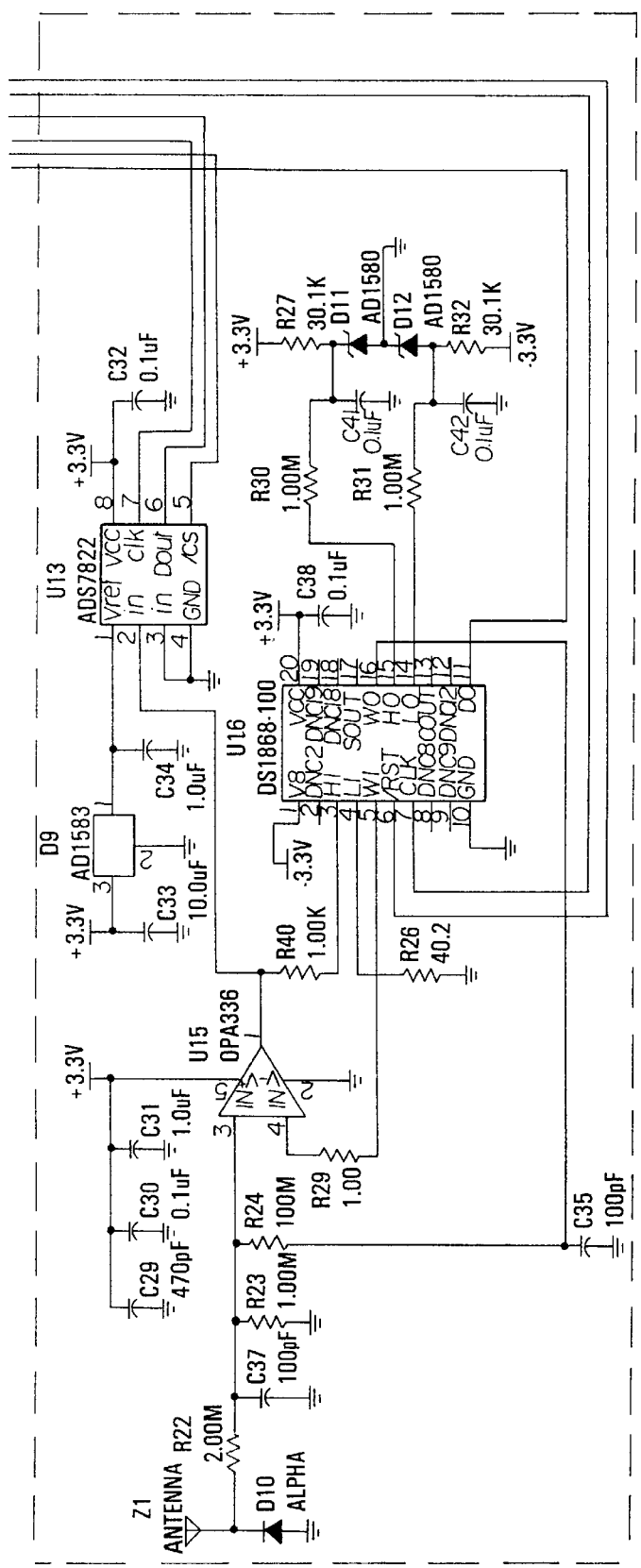
FIG. 7C is a schematic of a Z axis subsystem useful in the practice of the present invention.
Figure 7D:
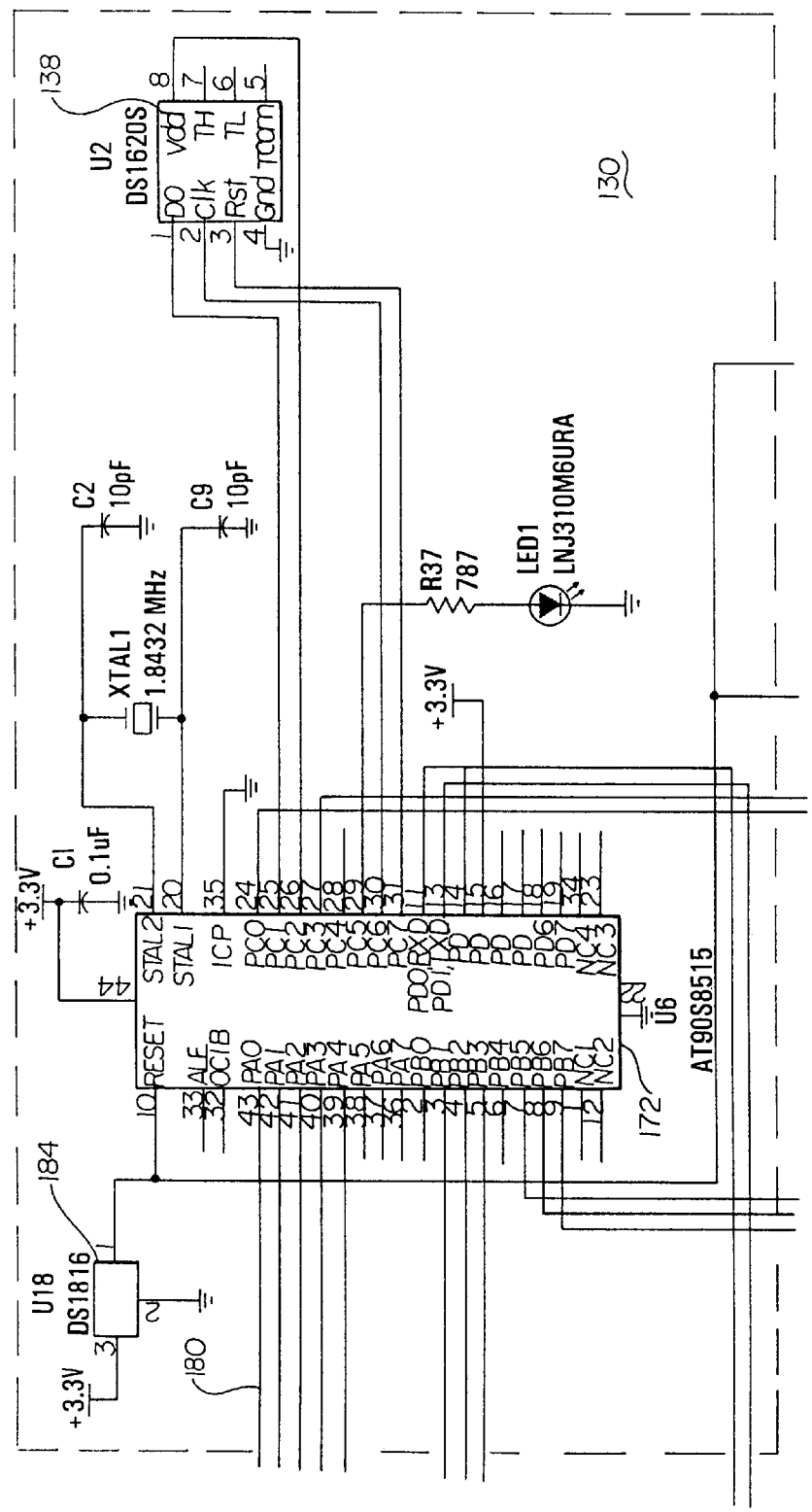
FIG. 7D is a schematic of a controller subsystem useful in the practice of the present invention.

Referring now to FIG. 7D, controller subsystem or sub-circuit 130 includes the micro controller 172, a reset controller chip 184, and the temperature sensor 138. The reset controller chip 184 is available under part number DS 1816R-10 from Dallas Semiconductor. The temperature sensor 138 is available as part number DS1620S from Dallas Semiconductor. Micro-controller 172 is a reduced instruction set computer (RISC) used to provide all Probe electronics control functions. The micro-controller 172 reads internal and external sensor data, provides internal control signals, stores and retrieves key Probe identifier and calibration data, and provides for two-way data communication via the fiber-optic interface.

Controller circuit functions include:

1. Providing offset-adjust and gain-adjust control words for each of the three analog signal conditioning circuits.
2. Reading the digitized sensor output levels.
3. Reading the internal temperature sensor output.
4. Reading the battery gas-gauge output.
5. Storing and retrieving information including: the Probe identifier, Probe serial number, calibration date, software revision and battery status.
6. Storing and retrieving calibration curve-fitting equation coefficients unique to that sensor.
7. Providing serial data communication between the Probe 72 and the external Readout 74 or other data collection system using fiber-optic cables to minimize unwanted signal pickup and test chamber field disturbance.

Figure 7E:
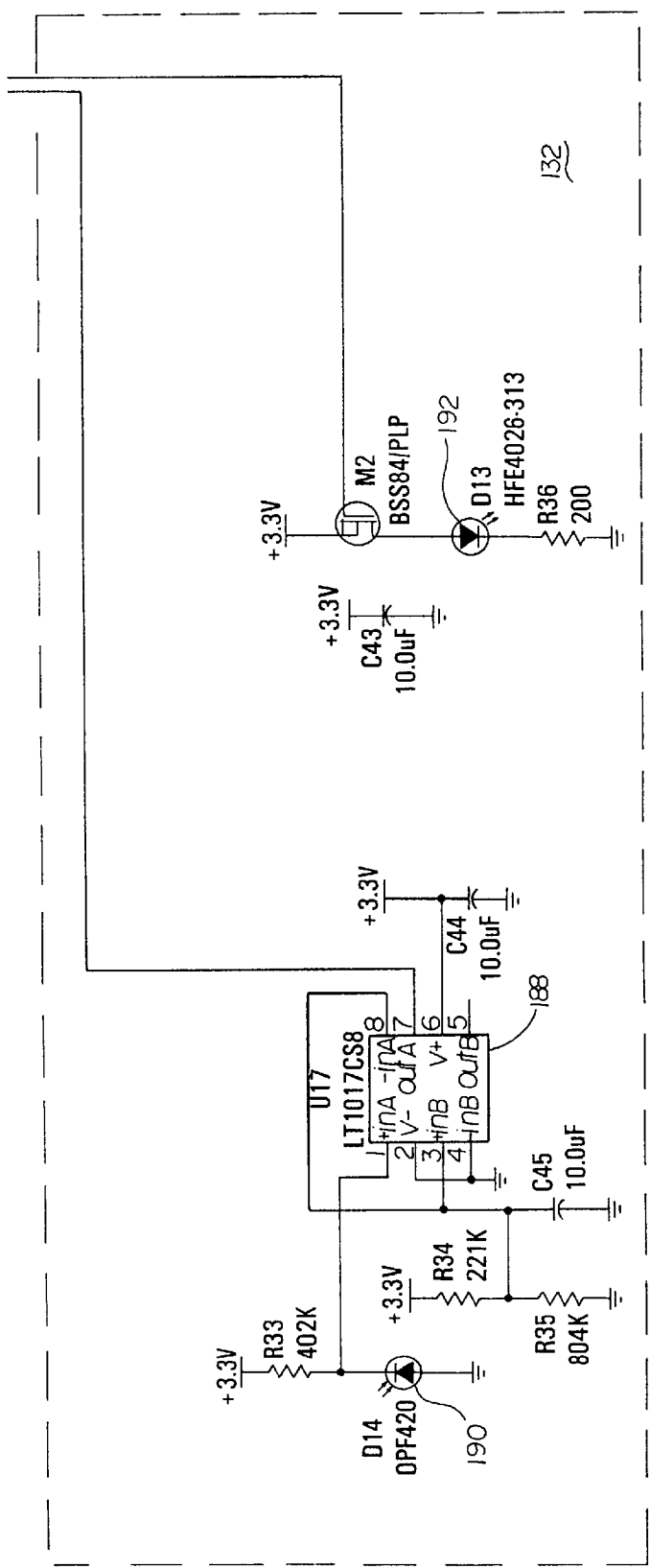
FIG. 7E is a schematic of an optical communications subsystem useful in the practice of the present invention.

Referring now most particularly to FIG. 7E, the optical transducers block 132 includes a comparator 188 available under part number LT1017CS8 from Linear Technology. Comparator 188 "squares up" the signal received on light activated diode 190 serving as an optical "receiver" for the Probe 72 in the fiber optic link to the Readout 74. A light emitting diode 192 serves as an optical "transmitter" for Probe 72 in the optical link to the Readout 74. It is to be understood that there is a corresponding pair of transmitter and receiver diodes in Readout 74 to complete the optical link between the Probe 72 and Readout 74. Diode 190 is preferably an Optec OPF-420 pin diode fiber optic receiver, and diode 192 is preferably a Honeywell HFE-4026-313 fiber optic transmitter diode. Preferably, each of diodes 190 and 192 is matched or coupled to the fiber optic cable using a model HI-1 LED detector pair in assembly part number 491194-01 available from General Photonics Corp., 5690 Schaefer Ave. #A, Chino, Calif. 91710.

Figure 7F:
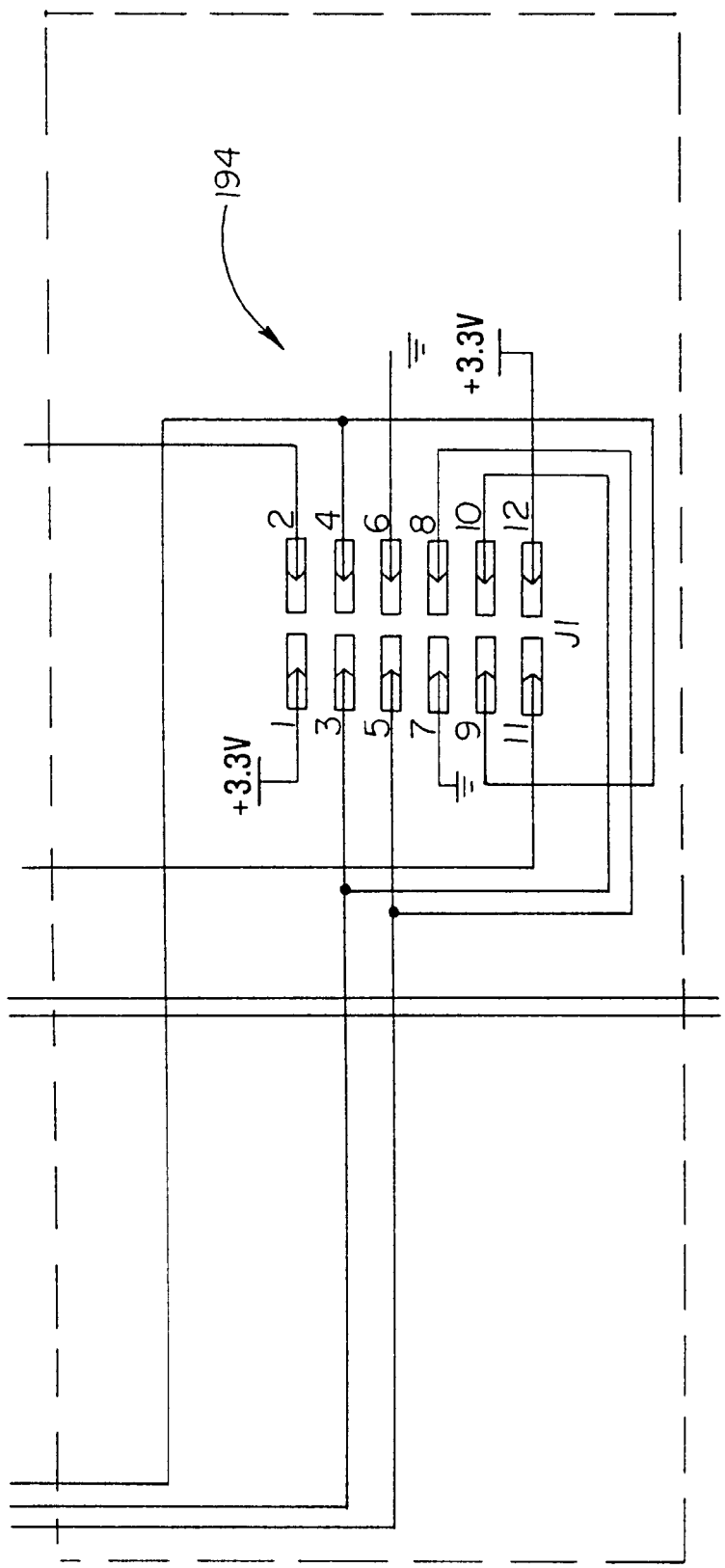
FIG. 7F is a schematic of a connector subsystem useful for reprogramming the Probe of the present invention.

Referring now to FIG. 7F, a connection diagram for a connector subsystem 194 may be seen. The connector subsystem is available to allow reprogramming of and upgrades to microcontroller 172.

Figure 7G:
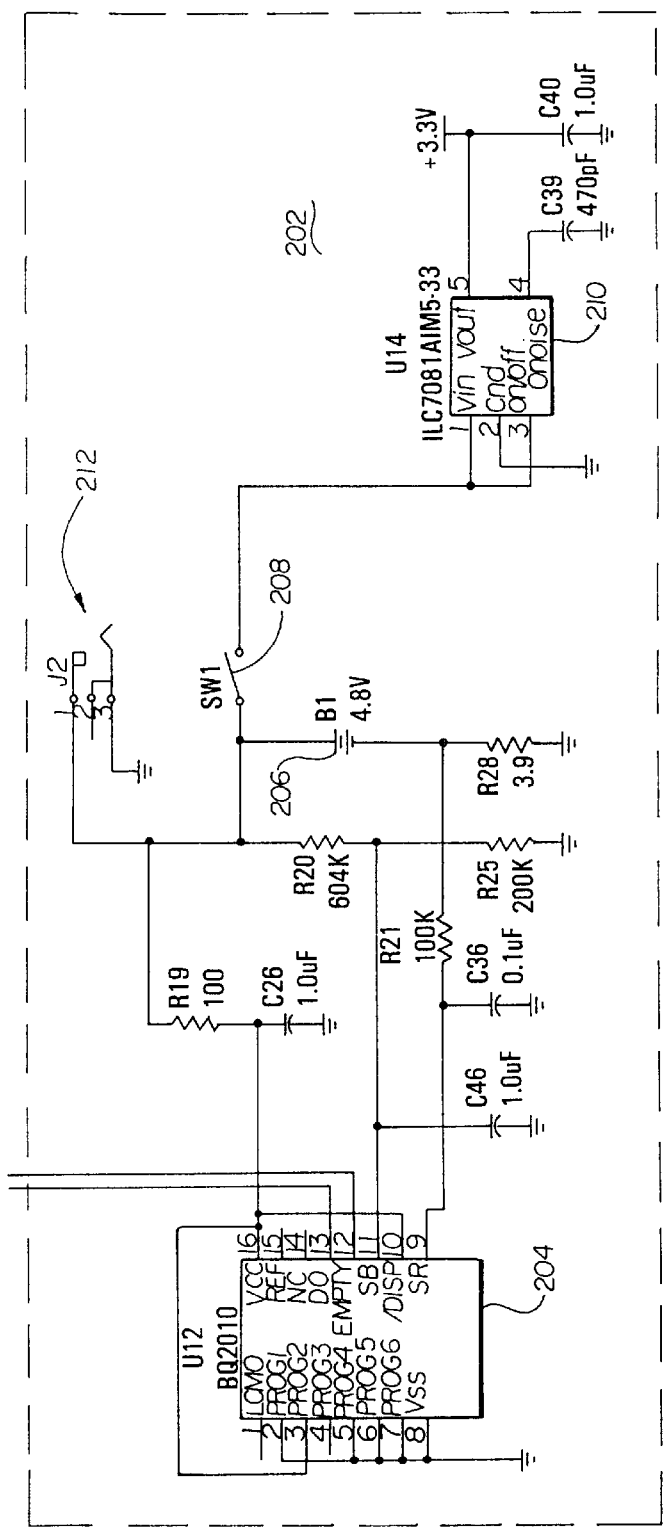
FIG. 7G is a schematic of a battery monitor subsystem useful in the practice of the present invention.
Figure 7H:
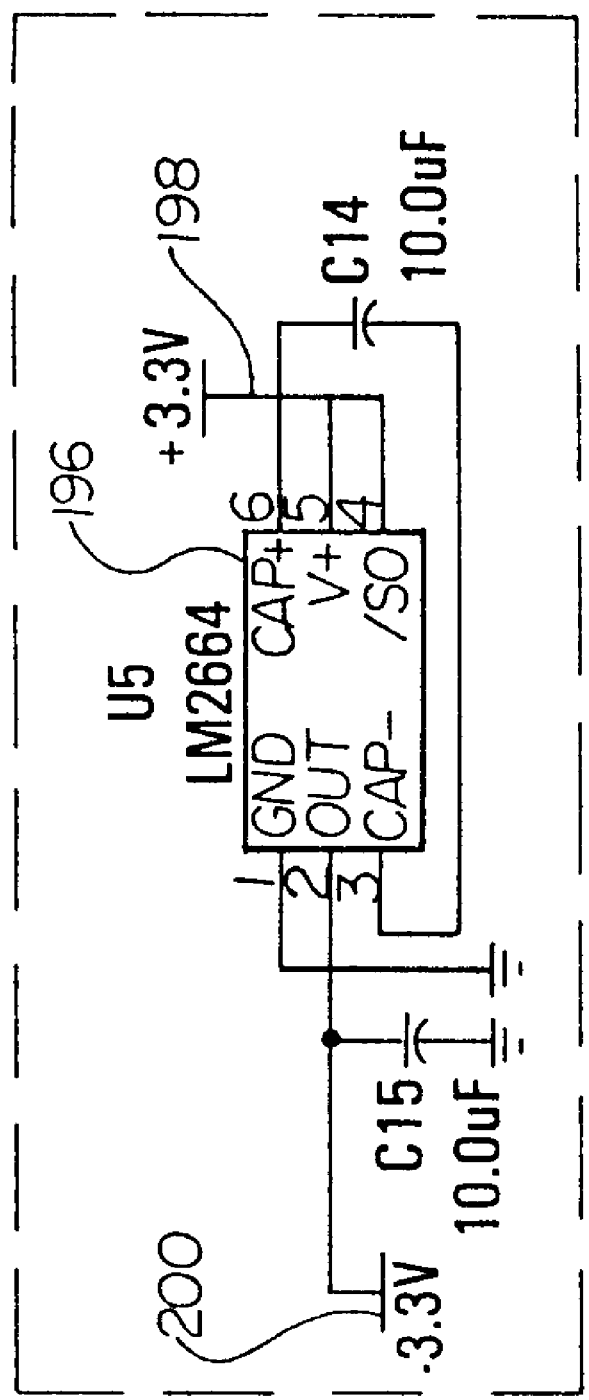
FIG. 7H is a schematic of a negative voltage generator subsystem useful in the practice of the present invention.

Referring now to FIG. 7H, a voltage inverter 196 is available under part number LM2664M6 from National Semiconductor. Inverter 200 is a switched capacitor voltage converter which inverts the positive voltage of 3.3V at terminal 198 to a corresponding negative 3.3V at terminal 200 for use by the digital potentiometer 166 for input offset voltage adjustment of amplifier 164 in each of the three axis subsystems 126X, 126*i y*, and 126Z.

Referring now to FIG. 7G, a battery monitor and voltage regulator subsystem 202 may be seen. This subsystem includes a "gas gauge" integrated circuit 204 available under part number BQ2010SN from Texas Instruments, Benchmarq Products division. A 4.8V rechargeable nickel metal hydride battery 206 provides power through an ON-OFF switch 208 to a voltage regulator circuit 210 available under part number ILC7081AIM5-33 from Impala Linear Corporation. Battery 206 may be recharged from a charger (not shown) connected through a conventional two terminal jack 212.

Probe Firmware

The following is a description of the embedded software (or "firmware") present in the micro-controller 172 of the Probe 72:

Power Up: Upon power-up, the embedded software initializes the micro-controller 172 to the attached hardware in the Probe 72.

Main Loop:

1. Read the A/D converters 174 for each axis. The A/D converters are clocked simultaneously (on line 180) for higher measurement precision.
2. Test to see if the A/D converter reading is within the range limits.
2a. If the A/D converter reading is outside the range limits, change the signal conditioning gain setting, take another reading and test again.
3. Store the A/D converter reading and the signal conditioner gain setting in a buffer ready to send to the Readout 74 or calibration station (not shown).

When the Readout 74 requests data from the Probe 72, the last buffered A/D converter reading and signal conditioner gain setting is transmitted from the Probe 72 to the Readout 74

It is to be understood that the micro-controller 172 has a Universal Asynchronous Receiver/Transmitter (UART). The UART receiver interrupt is enabled, so that when a command is sent to the Probe, the interrupt service routine branches to the command processing routine. After the command is processed, the program returns to the Main Loop.

The commands that the Probe will respond to are listed below. If an invalid command is sent to the Probe, an error message is returned from the Probe as follows:

E3: invalid command
E4: invalid parameter for a valid command
E9: calibration setting commands have not been unlocked Automatic Gain Control Routine:

The "Automatic Gain Control" routine tests the A/D converter reading for each axis and determines whether or not the analog signal conditioning gain needs to be changed.

If the analog signal conditioning gain is set to the highest value, and the A/D converter reading is above F70h (i.e., "F70" in hexadecimal format), then the analog signal conditioning gain is reduced to the next lower gain setting.

If the analog signal conditioning gain is set to one of the mid-values, and the A/D converter reading is below 064h, then the analog signal conditioning gain is increased to the next higher gain setting, or if the A/D converter reading is above F70h, then the analog signal conditioning gain is reduced to the next lower gain setting.

If the analog signal conditioning gain is set to the lowest value, and the A/D converter reading is below 064h, then the analog signal conditioning gain is increased to the next higher gain setting.

| If gain = | and A/D converter reading is | then change gain to |
|---|---|---|
| FFh | <064h | increase to 10h |
| 10h | <064h | increase to 01h |
| 01h | <064h | increase to 00h |
| 00h | >F70h | decrease to 01h |
| 01h | >F70h | decrease to 10h |
| 10h | >F70h | decrease to FFh |

Command Sets:

Calibration Command Set

Note: The character ↵ indicates a carriage return.

The following are commands that the Probe responds to during calibration:

| Command | Command Name | Description |
|---|---|---|
| Null | Null | Respond with a "N and Carriage Return". |
| I↵ | Identify Probe | "Send Information" to the calibration station. This includes Probe identifier -(6005),Software Revision Date, Probe Serial Number, Calibration Date, and Battery Status. |
| G↵ | Manual Gain Set | Disable Autorange and set gain to specified setting. |
| Q↵ | Restore Autorange | Restore Autorange. |
| CODE↵ | Unlock Calibration Commands | Unlock the calibration commands that are capable of modifying the Probe calibration |
| O↵ | Auto Offset Adjust | The Automatic Offset Adjust routine automatically injects a voltage to the input of the Op-Amp circuit (on line 168). |
| W↵ | Manual Offset Adjust | Manually control the voltage injected to the input of the Op-Amp circuit. |
| L↵ | Store Calibration Coefficients | Store the calibration coefficients transmitted from the Readout 74. |
| M↵ | Send Calibration Coefficients | Transmit the calibration coefficients back to the calibration station (Readout). |
| C↵ | Store Probe Serial Number | Store the serial number of the Probe. |
| J↵ | Store Probe Calibration Date | Store the calibration date of the Probe. |
| X↵ | Turn On Transmit Diode | Turn on transmitter LED 192 for 5 seconds to test the optical power of the transmitter fiber optic interface. |

Readout Command Set

The following are commands that the Readout sends to the Probe during measurement operations:

| Command | Command Name | Description |
|---|---|---|
| Null | Null | Respond with a "N and carriage return". |
| I↵ | Identify Probe | Send information to the Readout. This includes Probe identifier (6005), Software Revision Date, Probe Serial Number, Calibration Date, and Battery Status. |
| Y↵ | Send Probe Serial Number | Return Probe Serial Number. |
| D3↵ | Calculate Calibrated V/m Reading | Return the calibrated V/m reading for each axis. |
| S↵ | Send Raw Data | Return the reading as Raw Data. |
| BP↵ | Send Remaining Battery Capacity | Return the Probe battery capacity. |
| B↵ | Send Battery Voltage | Return the Probe battery capacity in "voltage" units. |
| T↵ | Send Temperature Data | Return the Probe temperature chip Raw Data. |
| TC↵ | Send Temperature in ° C. | Return the Probe temperature in Celsius. |
| TF↵ | Send Temperature in ° F. | Return the Probe temperature in Fahrenheit. |
| M↵ | Send Calibration Coefficients | Transmit the calibration coefficients to the Readout. |
| F↵ | Set Baud Rate | Change the baud rate. |
| Z↵ | Begin Burst Mode | Begin sending Raw Data in Burst mode. |
| U↵ | Stop Burst Mode | Stop sending Raw Data in Burst mode. |

The following are details of the specific routines corresponding to the various commands:

I identify Probe Routine

The Readout 74 (or a calibration computer) sends the following string to the Probe 72: I↵

The program branches to the "Identify Probe" routine.

The (6005) Probe identifier is embedded in the Probe software.

The software revision (mmddyyyy)is embedded in the Probe software.

Using the C command, the Probe serial number is stored in non-volatile memory.

Using the J command, the Probe calibration date is stored in non-volatile memory.

The battery status is a Normal/Fail status line from the gas gauge chip 204, which monitors the battery voltage.(This is different than the battery capacity measurement calculated by the gas gauge chip).

The Probe sends a start character→(:).

The Probe returns the command it received→(I).

The Probe identifier is transmitted to the Readout→(6005).

The software revision is transmitted to the Readout→(mmddyyyy).

The Probe serial number is transmitted to the Readout→(ssssssss).

The Probe calibration date is transmitted to the Readout→(mmddyyyy).

The battery status is transmitted to the Readout→(N for Normal, F for Fail).

A carriage return is sent as an end character→(↵).

The full character string is exemplified as follows I6005mmddyyyyssssssssmmddyyyyN↵

G Manual Gain Set Routine

The Readout or calibration computer sends the following string to the Probe: $Gg_xg_xg_yg_yg_zg_z$↵

The program branches to the "Manual Gain Set" routine.

Disable the autorange flag. This flag is checked by the autorange routine. If autorange is disabled, then this routine is skipped.

Collect the gain settings from the calibration computer ($g_x g_x g_y g_y g_z g_z$). The gain settings are the values used to set the gain digital trimpots (in chips 166 for each axis) to the proper setting.

For example, if the gain value is 10h (i.e., "10" in hexadecimal format), the gain digital trimpot is set to position 16 (decimal format) by the routine that sets the gain digital trimpots to their specified settings.

Set the gain digital trimpots 166 to their specified settings.
Read the A/D converters 174.
The Probe 72 sends a start character→(:).
The Probe 72 returns the command it received→(G).
The A/D converter reading for each axis is transmitted to the Readout 74→(xxxyyyzzz).
The gain setting for each axis is transmitted to the Readout 74→($g_x g_x g_y g_y g_z g_z$).
The battery status is transmitted to the Readout 74→(N for Normal, F for Fail).
A carriage return is sent as an end character→(↵). :Gxxxyyyzzz$g_x g_x g_y g_y g_z g_z$ N(↵).

Q Restore Autorange Routine

The calibration computer (acting as a Readout 74) sends the following string to the Probe 72: Q↵

The program branches to the "Restore Autorange" routine.

Enable the autorange flag. This flag is checked by the autorange routine.

If the autorange flag is disabled, then the Autorange routine is skipped. The autorange flag is enabled in the Restore Autorange routine so that the next time the Autorange routine is called by the Main Loop, the Autorange routine will be executed. The autorange flag is only disabled by the Manual Gain Set command. The Restore Autorange command is only used to reenable the autorange flag after a Manual Gain Set command has been sent.

The Probe sends a start character→(:).
The Probe returns the command it received→(Q).

A carriage return is sent as an end character→(↵). :Q↵

CODE Unlock Calibration Commands Routine

The calibration computer sends the following string to the Probe 72: CODE↵
(Note: "CODE" is used as an example, it is not the actual string.)

The program branches to the "Unlock Calibration Commands" routine.

Enable the unlocked flag. This flag is checked by the calibration routines that are capable of modifying the memory where calibration settings are stored.

If the unlocked flag is disabled, then the routines that modify the memory where the calibration settings are stored are skipped and an error message :E9↵ is sent back to the readout. These commands are O, W, L, C, and J.

The Probe sends a start character→(:).
The Probe returns verification that the unlock command was executed→(OK).

A carriage return is sent as an end character→(↵). :OK↵

O Auto Offset Adjust Routine

The calibration computer sends the following string to the Probe :O↵

The program branches to the "Auto Offset Adjust" routine.

If the calibration command set has been unlocked, the offset adjust routine will be executed.

Set the OFFSET digital potentiometers for each axis to setting 00. For each axis, the following procedure is executed:

1. The A/D converter 174 is read 50 times, and the minimum value from these readings is stored.
2. The minimum value from the 50 readings is tested to see if it is greater than 6.
3. If the minimum value is not greater than 6, the setting of the OFFSET digital potentiometer 166 for the axis being adjusted is incremented by one position.
4. This loop is repeated until the minimum value from the 50 readings is greater than 6. The OFFSET digital potentiometer setting is then stored in non-volatile memory.

When the procedure is completed, the Probe returns the OFFSET digital potentiometer settings to the calibration station for visual verification.

The Probe sends a start character→(:).
The Probe returns the command it received→(O).
The Probe returns the OFFSET digital potentiometer settings→($o_x o_x o_y o_y o_z o_z$).
A carriage return is sent as an end character→(↵). :Oo$_x$o$_x$o$_y$o$_y$o$_z$o$_z$↵

Note: During the initialization of the Probe, each time the Probe power is turned on, the OFFSET digital potentiometer settings are read from non-volatile memory, and the OFFSET digital potentiometers 166 for each axis are set to the respective saved settings.

W Manual Offset Adjust Routine

The calibration computer sends the following string to the Probe: Wo$_x$o$_x$o$_y$o$_y$o$_z$o$_z$↵

The program branches to the "Manual Offset Adjust" routine.

If the calibration command set has been unlocked, the Manual Offset Adjust routine will be executed.

Collect the OFFSET settings from the calibration computer ($o_x o_x o_y o_y o_z o_z$). The offset settings are the values used to set the OFFSET digital potentiometers 166 to the proper settings. For example, if the OFFSET value is 10h, the OFFSET digital potentiometer is set to position 16 (decimal) by the routine that sets the digital trimpots to their specified settings.

Store these settings in non-volatile memory.

Set the offset adjust digital trimpots to their specified settings.

Return the offset adjust values to the calibration station.
The Probe sends a start character→(:)
The Probe returns the command it received→(W).
The Probe returns the OFFSET adjust values→($o_x o_x o_y o_y o_z o_z$).
A carriage return is sent as an end character→(↵). :Wo$_x$o$_x$o$_y$o$_y$o$_z$o$_z$↵

Note: During the initialization of the Probe, each time the Probe power is turned on, the OFFSET digital potentiometer settings are read from non-volatile memory, and the OFFSET digital trimpots 166 are set to the saved settings.

L Store Calibration Coefficients Routine

The calibration computer sends the following string to the Probe: L "coefficient file"↵

The program branches to the "Store Calibration Coefficients" routine.

If the calibration command set has been unlocked, the Store Calibration Coefficients routine will be executed.

The coefficient file is a text file containing the calibration coefficients generated by the Mathematica Linearization program.

This file contains 576 characters, (72 numbers, 8 characters for each number). Each set of eight characters represents a number. The first character is "A" for positive, or "B" for negative. The next seven characters contain six digits and a "D" in the decimal point location. For example: A12D3456 would be a positive number, 12.3456. Each number is converted to a floating point number and is stored in non-volatile memory.

The Probe returns the command after all of the numbers have been stored.

The Probe sends a start character→(:)
The Probe returns the command it received→(L).

A carriage return is sent as an end character→(↵). :L↵
M Send Calibration Coefficients Routine The calibration computer or Readout sends the following string to the Probe: M↵

The program branches to the "Send Calibration Coefficients" routine.

The coefficients are stored in non-volatile memory as floating point numbers.

Each number is converted from floating point format to a set of eight characters that represent that number. The first character is "A" for positive, or "B" for negative. The next seven characters contain six digits and a "D" in the decimal point location. For example: A12D3456 would be a positive number, 12.3456. The eight character numbers are transmitted to the calibration computer or readout. 576 characters, (72 numbers, 8 characters for each number)are sent to the calibration computer or readout.

The Probe sends a start character→(:)
The Probe returns the command it received→(M).
The Probe sends the coefficients.

A carriage return is sent as an end character→(↵). :M
A12D3456
A12D3456
A12D3456
A12D3456
*
*
*
A12D3456↵

(Note: These coefficients are used to generate calibrated V/m readings for every possible Raw Data reading obtainable from the Probe.)

C Store the Probe Serial Number Routine

The calibration computer sends the following string to the Probe: Cssssssss↵

The program branches to the "Store Serial Number" routine.

If the calibration command set has been unlocked, the Store Serial Number routine will be executed.

The Probe receives the eight Probe serial number characters (sssssss) and stores the characters in non-volatile memory.

The Probe reads the non-volatile memory containing the Probe serial number characters, and returns the stored Probe serial number to the calibration station for visual verification.

The Probe sends a start character→(:)
The Probe returns the command it received→(C).
The Probe sends the Probe serial number→(sssssss).
A carriage return is sent as an end character→
:C00103117↵

J Store the Probe Calibration Date Routine

The calibration computer sends the following string to the Probe: Jmmddyyyy↵

The program branches to the "Store Calibration Date" routine.

If the calibration command set has been unlocked, the Store Calibration Date routine will be executed.

The Probe receives the eight Probe calibration date characters (mmddyyyy) and stores the characters in non-volatile memory.

The Probe reads the non-volatile memory containing the Probe calibration date characters, and returns the stored Probe calibration date to the calibration station for visual verification.

The Probe sends a start character→(:)
The Probe returns the command it received→(J).
The Probe sends the Probe serial number→(mmddyyyy).
A carriage return is sent as an end character→(↵). :J07202000↵

X Turn on Transmit diode Routine

The calibration computer sends the following string to the Probe: X↵

The program branches to the turn on "Transmit Diode" routine.

The Probe switches on the transmit diode 192 for five seconds to enable the testing of the transmit diode optical power. The output power of the transmit diode 192 can be measured when the transmit fiber optic cable is terminated to an optical power meter.

Y Send the Probe Serial Number Routine

The calibration computer or Readout sends the following string to the Probe: Y↵

The program branches to the "Send Serial Number" routine.

The Probe reads the non-volatile memory (in microcontroller 172) containing the Probe serial number characters, and returns the stored Probe serial number to the Readout.

The Probe sends a start character→(:)
The Probe returns the command it received→(Y).
The Probe sends the Probe serial number→(sssssss).

A carriage return is sent as an end character→(↵). :Ysssssss↵

(Note: The Readout displays information to the user including Probe serial number and battery status. The calibration date and software revision number are available to be displayed through menu items.)

D3 Calculate Calibrated V/m Reading for Each Axis Routine

The readout sends the following string to the Probe 72:D3↵

The program branches to the "Calculate Calibrated V/m Reading For Each Axis" routine.

For each axis:
The last stored A/D converter reading is used in the following equation:

$$V/m = i\ a + b*((A/D\ converter\ reading)^c)$$

The calibration coefficients a, b, and c are read from non-volatile memory (in chip 172).
The value for V/m is calculated.
The results for the V/m calculation for each axis is transmitted to the Readout 74.
The Probe sends a start character→(:)
The Probe returns the command it received→(D).
The Probe sends the Probe serial number→(x.xxxyy.yyzzz.z).

A carriage return is sent as an end character→(↵). :D1.23456.78901.2↵

Note: The above example reading is 1.234 V/m on the x-axis, 56.78 V/m on the y-axis, 901.2 V/m on the z-axis.

The axis, analog signal conditioning gain and the A/D converter value are used to determine which of the coefficient set is used in the curve-fitting equation.

S Send Raw Data Routine

The readout or calibration computer sends the following string to the Probe: S↵

The program branches to the "Send Raw Data" routine.

The Probe transmits the last stored A/D converter readings for each axis and the analog signal conditioning gain settings for each axis and the battery status to the Readout.

The Probe sends a start character→(:)

The Probe returns the command it received→(S).

The Probe sends the A/D converter readings for each axis→(xxxyyyzzz).

The Probe sends the amplifier gain settings for each axis→($g_xg_xg_yg_yg_zg_z$).

The battery status is transmitted to the readout→(N for Normal, F for Fail).

A carriage return is sent as an end character→(↵). :Sxxxyyyzzz$g_xg_xg_yg_yg_zg_z$N↵

(Note: the Readout uses the A/D converter reading, the analog signal conditioning gain setting, and the axis information to look up the calibrated V/m reading from the tables generated during initialization of the system.)

BP Send Remaining Battery Capacity Routine

The readout or calibration computer sends the following string to the Probe: BP↵

The program branches to the "Send Remaining Battery Capacity" routine.

The routine reads the gas gauge chip 204 which monitors the battery charging and discharging and self discharging, and reports the remaining capacity of the battery 206.

The Probe transmits the remaining battery capacity data to the Readout or calibration station.

The battery capacity number is a two digit hex value, 00h for 0%, and 64h for 100%.

The Probe sends a start character→(:)

The Probe returns the command it received→(B).

The Probe sends the remaining battery capacity→(cc).

The battery status is transmitted to the Readout (N for Normal, F for Fail).

A carriage return is sent as an end character→(↵).:BccN↵

(Note: The Readout displays the battery status to the user.)

B Send Battery Voltage Routine

The Readout or calibration computer sends the following string to the Probe: B↵

The program branches to the "Send Remaining Battery Capacity" routine.

The routine reads the gas gauge chip 204 which monitors the battery charging and discharging and self discharging, and reports the remaining capacity of the battery 206.

The battery capacity number is a hex value, 00h for 0%, and 64h for 100%.

The battery capacity is converted to a number between 4.00 volts and 4.80 volts. (For compatibility with existing equipment, some existing readout software requires the battery information to be in a "voltage" format.)

The battery voltage number is transmitted to the Readout or calibration station.

The Probe sends a start character→(:)

The Probe returns the command it received→(B).

The Probe sends the remaining battery capacity→(v.vv).

The battery status is transmitted to the readout (N for Normal, F for Fail).

A carriage return is sent as an end character→(↵). :Bv.vvN↵

(Note: The "voltage" number returned by this command is not in units of "volts" but is only a relative number.)

T Send Temperature Data Routine

The Readout or calibration computer sends the following string to the Probe: T↵

The program branches to the "Send Temperature Data" routine.

The routine reads the temperature chip 138.

The temperature data is provided in a 16 bit, sign-extended two's complement hex number, with 0.5° C. resolution.

The temperature data is transmitted to the Readout or calibration station.

The Probe sends a start character→(:)

The Probe returns the command it received→(T).

The Probe sends the temperature data→(tttt).

A carriage return is sent as an end character→(↵).:Ttttt↵

(Note: The Readout displays the temperature to the user.)

TC Send Temperature ° C. Routine

The Readout or calibration computer sends the following string to the Probe: TC(↵).

The program branches to the "Send Temperature ° C." routine.

The routine reads the temperature chip.

The temperature data is provided in a 16 bit, sign-extended two's compliment hex number, with 0.5° C. resolution.

This data is converted to a Celsius number.

The temperature data in Celsius is transmitted to the readout or calibration station.

The Probe sends a start character→(:)

The Probe returns the command it received→(T).

The Probe sends the temperature data in ° C.→(ttt.).

A carriage return is sent as an end character→(↵).:Tttt.↵

(Note: The Readout displays the temperature to the user.)

TF Send Temperature ° F. Routine

The Readout or calibration computer sends the following string to the Probe: TF↵

The program branches to the "Send Temperature ° F." routine.

The routine reads the temperature chip.

The temperature data is provided in a 16 bit, sign-extended two's compliment hex number, with 0.5° C. resolution.

This data is converted to a Fahrenheit number.

The temperature data in Fahrenheit is transmitted to the Readout or calibration station.

The Probe sends a start character→(:)

The Probe returns the command it received→(T).

The Probe sends the temperature data in ° F. (ttt.).

A carriage return is sent as an end character→(↵).:Tttt.↵

(Note: The Readout displays the temperature to the user.)

F Set Baud Rate Routine

The Readout or calibration computer sends the following string to the Probe: Fb↵ b=1,→9600 baud rate b=2,→19200 baud rate b=3,→115200 baud rate

The program branches to the "Set Baud Rate" routine.

The routine changes the baud rate of the UART in the microcontroller 172 to the specified value. The Readout can then change its UART to operate at the specified baud rate.

Z Begin Burst Mode Routine

The Readout or calibration computer sends the following string to the probe: Z↵

The program branches to the "Begin Burst Mode" routine.

The routine sets the burst mode flag that the program polls to determine if the buffered Raw Data is to be sent continuously.

If the flag is set, then the buffered Raw Data is to be sent continuously.

The probe sends the following string repeatedly, without a query for the next string.

The probe sends a start character→(:)

The probe returns the command it received→(Z).

The probe sends the A/D converter readings for each axis→(xxxyyyzzz).

The probe sends the A/D converter readings for each axis→($g_xg_xg_yg_yg_zg_z$).

The battery status is transmitted to the readout→(N for Normal, F for Fail).

A carriage return is sent as an end character→(↵).

---

Zxxxyyyzzz$g_xg_xg_yg_yg_zg_z$N↵
Zxxxyyyzzz$g_xg_xg_yg_yg_zg_z$N↵
Zxxxyyyzzz$g_xg_xg_yg_yg_zg_z$N↵
Zxxxyyyzzz$g_xg_xg_yg_yg_zg_z$N↵
Zxxxyyyzzz$g_xg_xg_yg_yg_zg_z$N↵
Zxxxyyyzzz$g_xg_xg_yg_yg_zg_z$N↵
*
*
*
Zxxxyyyzzz$g_xg_xg_yg_yg_zg_z$N↵

---

U Stop Burst Mode Routine

The Readout or calibration computer sends the following string to the probe: U↵

The program branches to the "Stop Burst Mode" routine.

The routine clears the burst mode flag that the program polls to determine if the buffered Raw Data is to be sent continuously.

If the flag is cleared, then the buffered raw data is not sent continuously.

The probe sends a start character→(:)

The probe sends an U→(U)

A carriage return is sent as an end character→(↵). :U↵

Null Respond to Null Routine

The Readout or calibration computer sends the following string to the probe: <Nul>↵

The program branches to "Respond to Null" routine.

The probe sends a start character→(:)

The probe sends an N→(N)

A carriage return is sent as an end character→(↵). :N↵

(Note: the "N" character is sent for compatibility with prior generations of equipment offered by the assignee of the present invention.)

Probe Calibration

Calibration Overview

The present invention uses calibrated output values at many discrete field levels to provide calibration data, but differs dramatically from the prior art in how that data is used to produce a calibrated field measurement. Rather than storing a large linearity table in the sensor, in the practice of the present invention the calibration data is analyzed, reduced and stored in reduced form in the Probe subsystem 72, all while retaining high calibration accuracy for later use by the Readout subsystem 74.

Improved linearity is obtained by applying a highly accurate nonlinear or curvilinear piecewise (segmented) curve-fitting equation to Raw Data measured under controlled conditions at the time of manufacture. The curve-fitting procedure preferably uses the Levenberg-Marquardt Method using Chi-Squares, as is available in the Experimental Data Analyst portion of the Mathematica software available from Wolfram Research, Inc. Before performing a measurement, the Readout 74 queries the Probe 72 for the calibration coefficient numerical values, and then rebuilds the equations in order to generate calibrated measurement values from the digital representation of the measured count and gain numerical values for the Raw Data.

Raw Data is initially recorded as a group of data sets for a known field over a pre-determined set of gain settings of the Probe. Individual entries (x) from each of the data sets are then individually curve-fitted by the equation: $V/m = a + bx^c$ preferably with very high accuracy piece-wise fits. The coefficients (a, b, and c) for each set or segment are then stored in the Probe instead of storing the actual measured calibration points (i.e., individual corresponding V/m values). The present invention requires much less Probe memory than prior art techniques to achieve the same or greater accuracy. The memory requirement is now based on the number of curve-fit segments rather than the number of available calibration points. The method of the present invention uses the same small amount of memory independent of the calibration data set size. Therefore, if extremely high accuracy is required, a much larger calibration data set can be taken and a closer curve fit obtained without increasing the storage requirements for calibration data.

Linearity Calibration Details

Figure 5:
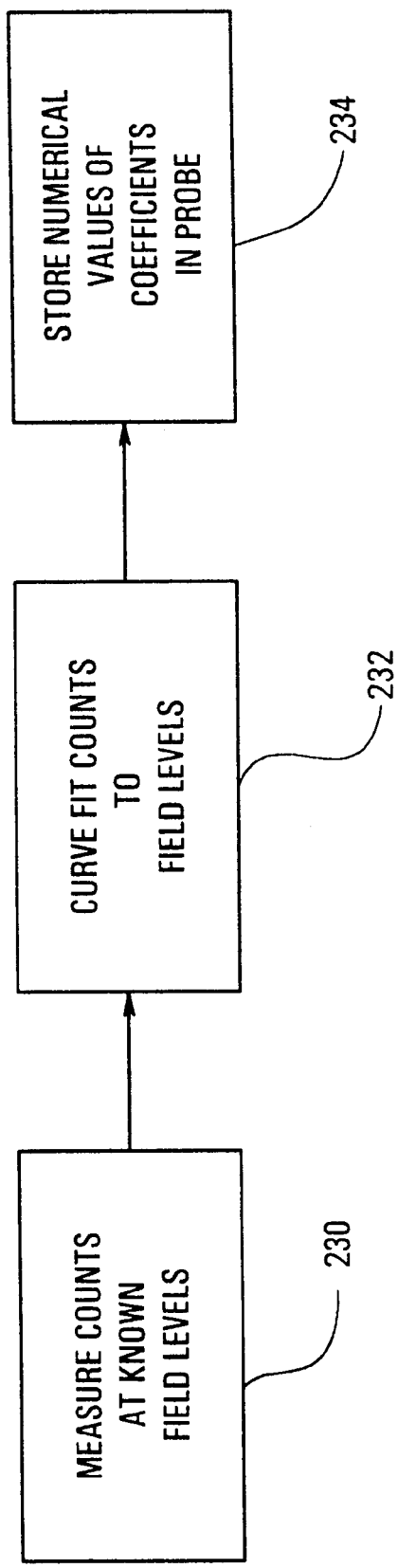
FIG. 5 is a simplified block diagram of a method of calibrating the Probe of the present invention.

A simplified block diagram of the process of calibrating the Probe 72 is illustrated in FIG. 5. In block 230, the Probe 72 is placed in a known field, and Raw Data is acquired in the form of count values from the A/D converter and associated with the known field amplitude. In block 232, a curve-fitting equation is used to fit or correlate the Raw Data to the known field level. This step is performed in a calibration computer connected in place of the Readout. In block 234 the specific numerical values for the coefficients of the curve-fitting equation segment under consideration are stored in the Probe 72 for later use in taking measurements of unknown fields. The process of FIG. 5 is repeated at various levels of known fields until sufficient accuracy for the curve-fitting process is obtained.

A more detailed statement of the calibration process is as follows.

1. The auto-range function is disabled in the Probe 72, and the gain setting that corresponds to the first auto-range gain setting is manually selected.
2. The Probe 72 is placed in a known calibrated field.
3. The A/D converter reading (counts) is recorded.
4. The known field is increased to the next known calibrated field level.
5. The A/D converter reading for the new field level is recorded.
6. This process is repeated until all of the known calibrated field points that cover the selected Probe gain setting are covered.
7. The data including the known applied volts per meter of the applied calibration field and A/D converter readings (Raw Data) are stored in a table.
8. The next gain setting corresponding to the next auto-range gain setting is manually selected.
9. The procedure of recording the A/D converter reading for the known calibrated field levels is repeated for each of the gain settings used in the Probe 72.
10. When the collection of the data is complete, there are a group of tables that include the volts per meter calibration points and the corresponding A/D converter reading over each gain that the Probe uses, for each axis of the Probe 72.
11. This data is imported into the linearization routine, (which preferably is the Levenberg-Marquardt Method of the Experimental Data Analyst application package of the Mathematica program, but may use other curve-fitting techniques while still remaining within the spirit and scope of the present invention).

12. The data is segmented into pieces whose size and endpoints were selected in order to optimize the accuracy and speed of the linearization routine. It has been found desirable to have two segments for each Auto-Range Gain Setting for the embodiment disclosed herein. The top point of the bottom segment and the bottom point of the top segment are selected where the curve fit routing yielded the most accuracy throughout each curve fit region. During the design of the linearization routine, the Auto-Range gain settings were selected such that there was sufficient overlap in the range of A/D converter readings from one gain setting to the next, for the auto ranging function to work properly. It is to be understood to be within the present invention to use only one segment or to use more than two segments, if desired.

13. Each segment is "curve fitted" to an equation, which is preferably of the form volts per meter=V/m=$a+bx^c$ 14. The numerical values for coefficients a, b, and c are extracted from the equation, and processed to each contain only six digits, a decimal point and a positive or negative sign, resulting in a defined set of characters to be stored in the memory of the micro-controller 172 of the Probe 72. Again it is to be understood that variations may be made in the form of the curve-fitting equation, with the number of coefficients dependent upon the form of equation selected. Furthermore, the resolution and precision of the coefficient numerical values may be varied while still remaining within the scope of the present invention.

15. A list of the coefficients (numerical values) for each equation segment for each axis is put together and stored in a file.

16. This file is loaded into the Probe setup program, and the coefficients are transmitted to the Probe in a pre-defined order, where they are stored in non-volatile memory, preferably in the micro-controller 172.

17. When the Probe is connected to a "smart" Readout, the Readout issues a command to the Probe for the Probe to send the list of coefficients to the Readout.

18. The Readout uses the coefficients and the curve-fitting equation to convert the counts in the Raw Data that the Probe transmits for each reading to volts per meter.

An example illustrating this calibration process is as follows.

1. The Probe is placed in a calibration station and the A/D converter count is recorded along with the signal conditioning gain setting for each applied known calibrated field value in V/m.

2. The curve-fitting process using the Mathematica program is carried out on the recorded sequential sets of data pairs of A/D counts and known V/m values. This process is repeated for all values in each of two segments, for each of four signal conditioning gain settings and for each of the three axes.

Data is collected for the portion of the x axis segment between the first point less than 500 A/D converter counts and the first point less than 4095 A/D converter counts for the signal conditioning gain of 00. The following table shows a decimal representation of the average of multiple readings from the A/D converter in response to the known field. Typically between 1 and 20 readings are taken to obtain the averaged A/D converter reading. The averaged reading is used for the A/D converter count value in the curve fitting process.

| Applied V/m | A/D Converter reading (averaged) |
| --- | --- |
| 0.986663 | 242.75 |
| 2.01419 | 958.15 |
| 3.00892 | 2094.25 |
| 3.60877 | 2982.4 |
| 4.04547 | 3716.5 |
| 4.23148 | 4047.5 |

Results of the curve-fitting of the data to the function form

V/m=a+b (A/D converter count)$^c$ yields:

V/m=0.00483+0.05765(A/D converter count)$^{0.51694}$

Thus the coefficients for this segment are: a=0.00483, b=0.05765 and c=0.51694.

3. Determine the error between the actual field value and the result of the curve-fitting process.

4. Verify that the error is within an acceptable level, i.e., within product specifications.

5. Once all calibration points are within an acceptable level, store the coefficients in a non-volatile memory in the Probe.

| Applied V/m | A/D converter count (averaged) | Calculated V/m using curve-fitting equation | dB error 20 log (calculated/applied) |
| --- | --- | --- | --- |
| 0.986663 | 242.75 | 0.990618 | 0.034744 |
| 2.01419 | 958.15 | 2.0094 | −0.0206657 |
| 3.00892 | 2094.25 | 3.00794 | −0.00282987 |
| 3.60877 | 2982.4 | 3.61013 | 0.00328226 |
| 4.04547 | 3716.5 | 4.04449 | −0.0021159 |
| 4.23148 | 4047.5 | 4.22664 | −0.00994259 |

The dB error values are tested against the product specifications of ±0.5 dB error in V/m over the range of 0.5 V/m to 800 V/m for each individual axis.

An example of the use of the present invention (after calibration) is as follows:

1. When the Probe is connected to the Readout, the Readout downloads the stored coefficients from that Probe. The Readout can be a personal computer (PC) running a virtual readout software program, i.e., a "fixed" (closed code) program for use on a PC or a hand held Readout such as a model HI-4460 available from the assignee of the present invention, or a rack mounted PC operating as a Readout, or a user can create and use their own custom application software using the Active X Probe Interface Software.

2. The Readout builds the curve-fitting equation to calculate the calibrated V/m value based on the corresponding A/D converter count. The coefficient variables used in the curve-fitting equation have numerical values which are inserted corresponding to the segment appropriate for the A/D converter count and the signal conditioning gain setting that are transmitted from the Probe to the Readout for each data point of interest.

As a numerical example, if the applied field is 3.60877 V/m aligned with the x axis, and the Readout requests a reading from the Probe by sending command "S" to the Probe, the Probe will transmit the character string :SBA61 F43 DA0001FFN<CR>
where the first three characters following the :S are the x axis A/D converter count value characters in Hexadecimal format, the next three characters are for the y axis, the next three characters are for the z axis, and the next two ($10_{th}$ and $11_{th}$) characters following the :S specify the signal conditioning gain setting for the x axis. Similarly the $12^{th}$ through $15^{th}$ characters are the gain settings for the y and z axes, respectively, and the last character before the carriage return is a battery status indicator. This string corresponds to the Send Raw Data routine response. Here, $BA6_{hex}=2982_{decimal}$ and the signal conditioning gain setting is 00 for the x axis. In the character string the ":" is a start command, followed by a command letter, followed by data, if required, and terminated with a <CR> (carriage return), in the format:Sxxxxyyyyzzzz$g_xg_xg_yg_yg_zg_z$N<CR> in response to a READ PROBE DATA command.

3. The Readout selects the coefficients for the curve-fitting equation based on the signal conditioning gain setting for the x axis and the A/D converter count value for the x axis.

Continuing the numerical example, the coefficient numerical values are a=0.00483, b=0.05765, and c=0.51694. Using these numerical values for the coefficients in the curve-fitting equation, the Readout calculates 3.60987 V/m for the x axis.

Readout Overview

As is apparent from the remarks about the Readout made above in connection with various aspects of the Probe, the Readout software sends identification and operating commands to the Probe 72 and reads the information sent back from the Probe. Either the Probe or the Readout (depending upon the mode of operation) performs the calculations to generate the calibrated field readings from the Raw Data, and the Readout then displays the calculation results and Probe information to the user. The Readout may store or forward such results as desired for subsequent use.

Readout Operation

Figure 6:
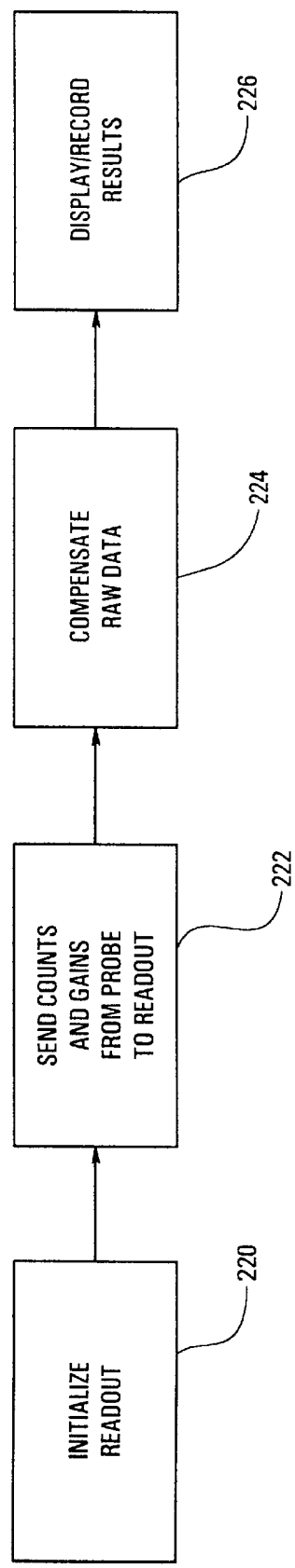
FIG. 6 is a simplified block diagram of a method of operating the Probe and Readout of the system of the present invention.

FIG. 6 illustrates a simplified block diagram or flow chart of the general operation for the Readout 74. In FIG. 6, the Readout is initialized in block 220. In a preferred mode of operation, Raw Data in the form of counts from the A/D converter 176 and the gain of op-amp 164 are sent from the Probe 72 to the Readout 74 in block 222. The Raw Data is compensated in block 224, and the results are displayed or recorded by the Readout in block 226.

Readout Subsystem Configuration Options

The Readout Subsystem 74 can take the following forms:
1. Windows ActiveX Object on a personal computer.
2. A Virtual Readout on a personal computer.
3. Software executed in a rack mounted Display/Data Acquisition Instrument.
4. Software executed in a handheld display instrument.

Readout Subsystem Mode Options

The present invention enables various methods of calculating the linearized field readings from the A/D counts and op-amp gain settings of the Raw Data, five of which are listed below:

Mode 1. (Comprehensive Look-Up Table Stored in Readout)

If the Readout has sufficient memory available, the Readout downloads the curve-fit coefficient numerical values from the Probe and calculates and stores calibrated field values that correspond to every possible set of count and gain combinations that the Probe could send to the Readout in a Comprehensive Look-Up Table in the Readout. When a measurement is performed, and Raw Data made up of the A/D count value and gain setting for the data point is transmitted from the Probe to the Readout, the Readout uses the count and gain setting as lookup parameters to read the corresponding calibrated stored electric field value (V/m) in the Comprehensive Look-Up Table. This results in a very fast operation, because all calculations are performed during initialization and stored, and the result is obtained simply by looking up an entry in the Comprehensive Look-Up Table. It is to be understood that this process is preferably performed for each axis, and that additional post-look-up operations may be performed, for example, to obtain a composite field reading.

Mode 2. (Limited memory, limited computing power Readout performing Linear Interpolation)

If the Readout has limited memory and computing power available, the Readout downloads the coefficients from the Probe and calculates and stores the V/m field readings for a limited set of counts and gain settings in a limited look-up table. When Raw Data is transmitted to the Readout, the data point is compared to the limited look-up table and a linear interpolation between the stored data points is performed to determine the V/m field value when the data point is between entries in the limited look-up table.

Mode 3. (Floating Point Arithmetic Readout)

If the Readout has the capability of performing floating-point mathematical operations, the Readout downloads the coefficients from the Probe and stores them in Readout memory during initialization. When a field measurement is taken, the curve-fitting equation is re-calculated for each reading using the coefficients that corresponds to the segment that includes the gain and A/D converter reading from the Probe. This method does not require large memory in the Readout to store either a comprehensive or limited look-up table, but only requires sufficient memory to retain the coefficients for each segment of the curve-fitting equation.

Mode 4. (Real Time Volume Data Capture with Post Processing in Readout)

If the Readout has sufficient memory available, and very fast measurement times are required, the Readout can download the curve-fit coefficients from the Probe and store them in Readout memory during initialization. When data acquisition is to be commenced, the Readout issues a command which instructs the Probe to operate in a "Burst" mode. When the Readout issues the "Begin Burst Mode" command the Probe immediately sends, and the Readout reads and stores Raw Data at full-speed. When data acquisition is desired to be halted, the Readout issues a "Stop Burst Mode" command to stop the Probe Raw Data output. The Readout then post-processes the stored Raw Data by calculating the calibrated V/m field values using the stored curve-fit coefficients, and displays or stores the calibrated data.

Mode 5. (Data Compensation in Probe)

If the Readout possesses limited memory and limited processing power, the Readout can issue a command which instructs the Probe to convert the raw data to a linearized calibrated field reading for each individual axis, then send that data out to the Readout. While this method is slow, it allows operation with a Readout with only data display capability, without requiring floating point arithmetic or substantial storage capability in the Readout.

Readout Subsystem Initialization

The Readout 74 requests the following information about the Probe 72: Probe identifier, software revision, serial number, calibration date, and battery status.

For Mode 1, the Readout requests the calibration coefficient values from the Probe. Once the coefficient values are received, the Readout generates a of lookup table that contains the calibrated V/m reading for every possible raw data reading obtainable from the Probe 72, for each axis, each analog signal conditioning gain setting, and each range of A/D converter readings.

An example for generating a set of lookup tables that contain the calibrated V/m reading for every possible Raw Data reading obtainable from the Probe 72, for each axis, each analog signal conditioning gain setting, and each range of A/D converter readings is as follows. A portion of the lookup table is generated by using the first set of coefficients downloaded from the Probe 72 in the equation V/m=a+b (A/D converter reading)$^c$. This portion will be used when the axis is x, and the analog signal conditioning gain is set to 00, and the A/D converter reading is between the values 0 and 550.

This portion of the table would include all the integers from 0 to 550 in one column, and the corresponding calculated calibrated V/m reading, which is generated from using the equation V/m=a+b (A/D converter reading)$^c$ with the coefficients a=−0.40674, b=+0.16622, c=+0.38357, and the values from 0 to 550 for the A/D converter reading variable in another column. This process is repeated for each set of coefficients for each portion of the lookup table.

For Modes 2 or 3 the Readout downloads the numerical coefficient values from the Probe. For Mode 2, the Readout calculates and stores the V/m field readings for a limited set of counts and gain settings in a limited look-up table.

For Mode 4, the Readout downloads the curve-fit coefficient numerical values from the Probe and store them in Readout memory.

For Mode 5, no further initialization of the Readout is necessary.

For each of the Modes, the Readout displays the Probe serial number and battery status to the user. The calibration date and software revision are displayed through menu items, or in the main window, depending upon the Readout used.

Readout Subsystem Operation (using Mode 3 as an example)

1. When the Probe 72 is connected to a Readout 74, the Readout 74 issues a command to the Probe for the Probe to send the list of numerical coefficient values to the Readout.
2. The Readout 74 uses the numerical values for the coefficients in the curve-fitting equation. V/ma+bx$^c$ to convert the counts or Raw Data (x) that the Probe 72 transmits for each reading, i.e., the digital representation of the measured field level, to volts per meter.
3. The Raw Data that the Probe sends to the Readout includes the A/D converter reading for each axis and the Auto-Range gain setting for each axis. This information is used by the Readout to select the appropriate set of numeric values for the coefficients to load into the curve-fitting equation. There is a set of numeric values for each coefficient for each of the three axis, for each of four Auto-Range gain settings, and for each of two specified ranges of A/D converter readings within each Auto-Range gain setting. This makes up 24 sets of coefficient values, with each set containing 3 coefficient values.

Readout Subsystem Operation (using Mode 1)

The Readout 74 performs the lookup of the calibrated V/m reading for each axis using the axis, analog signal conditioning gain and AVD converter reading as pointers to the table location containing the calibrated V/m reading.

The Readout 74 then performs additional calculations based on the settings the user has chosen. These may include calculation of the composite field reading, displaying the reading in units other than V/m, such as: $V^2/m^2$ or $mW/cm^2$, and the averaging of a specified number of readings.

ActiveX Interface

The ActiveX Interface is a software technology that operates in a Windows environment to provide the Readout subsystem functions for the present invention. The output data commands, input data format, and method map for the ActiveX Interface is as follows:

Output Data Commands and Input Data Format

| Output | Description | InputData Format |
|---|---|---|
| AEEE | Enable & Disable Axis (E to enable, D to disable) | :A |
| B | Battery Status returns a number based on voltage from a 3 cell pack | :B03.70 |
| D1 | Data Short form | :Dxxxxxuuu |
| D2 | Data Long form | :Dxxxxxuuurrrobaaa |
| R1 | Set Range 1 | :R1 |
| R2 | Set Range 2 | :R2 |
| R3 | Set Range 3 | :R3 |
| R4 | Set Range 4 | :R4 |
| RN | Next Range | :Rx − (x = range 1, 2, 3, 4) |
| TC | Temperature in Centigrade | :T0xxx. |
| TF | Temperature in Fahrenheit | :T0xxx. |
| U1 | Set to V/m | :U |
| U2 | Set to mW/cm$^2$ | :U |
| U3 | Set to (V/m)$^2$ | :U |
| UN | Next Unit | :U |
| Z | Zero | :Z |

The following are additional commands only for the Probe of the present invention:

D3 Refresh the data

B3 Refreshes the battery data

TC3 Refreshes the temperature data in Centigrade

TF3 Refreshes the temperature data in Fahrenheit

The following is a Method Map for the ActiveX Controller:

| | |
|---|---|
| InputData | Read Probe Data |
| OutputData | Send Commands |
| Xaxis | HI-6005 X axis |
| Yaxis | HI-6005 Y axis |
| Zaxis | HI-6005 Z axis |
| XYZ Axis | HI-6005 Field values |
| X Peak | HI-6005 X Peak Reading |
| Y Peak | HI-6005 Y Peak Reading |
| Z Peak | HI-6005 Z Peak Reading |
| X Y Z Peak | HI-6005 X Y Z Peak Reading |
| Clear Peak | Clear all Peak Readings |
| Temperature | HI-6005 Temperature |
| Battery | HI-6005 battery status as percent of full charge |
| Initialize | HI-6005 serial number calibration data software version uploads coefficients |
| SerialNo | Read Only - Probe serial number |
| ProbeSoftRev | Read Only - Probe Software Revision |
| CalDate | Read Only - Probe calibration date |

The following is a list of ActiveX User Selectable Options:

| Property | Description |
| --- | --- |
| Visible | True or False (1 or 0) |
| SampleRate | Samples per second (.0166–35) |
| Averaging | Sets the number of samples to be used in a floating average (0–50) |
| CommPort | Sets the communications port number |
| TimerEnabled | Enables internal timer (1 or 0) |
| PortOpen | True or False (1 or 0) |
| Type6005 | 1=HI-6005, 0=Other |
| Units | 1=V/m, 2=W/cm$^2$, 3=(V/m)$^2$ |
| Version | Read Only - ActiveX HI-6005 Control |

As can be seen from the above tables, the Readout 74 requests battery capacity information from the Probe 72 and displays the battery status to the user. Additionally, the Readout 74 requests temperature information from the Probe 72 and displays the temperature of the Probe 72 to the user. The embodiment disclosed has a dynamic range of 0.5 to 800 V/m, with a frequency response of 100 kHz to 5 GHz at a linearity of ±0.5 dB full scale and at an isotropicity of ±0.5 dB. The communication protocol for the Probe 72 is RS-232 Serial, asynchronous, with a 7 bit word length, odd parity, one stop bit, and operates at a 9600 Baud data rate.

It is to be understood to be within the scope of the present invention to use a magnetic field sensor in place of the electric field sensor. Magnetic field sensing is commonly done by using a conductive loop antenna (rather than a conductive monopole or dipole antenna) and detecting the induced current in the conductor caused by an incident magnetic field. Just as three mutually orthogonal monopole or dipole antennas can used to allow measurement of the total electric field, three mutually orthogonal loop antennas could be used to allow measurement of the total magnetic field. It is to be understood that other forms of magnetic (or electric) field sensors may also be used in the practice of the present invention.

For magnetic fields, calibration and measurement compensation would be performed as disclosed herein by substituting magnetic field units (such as amps/meter, A/m) for electric field units when performing the calibration test measurements, curve-fitting the data to create specific numerical values for calibration coefficients to store in the probe, and when compensating the data based on these coefficient numerical values. The user would be presented with calibrated magnetic field values rather than calibrated electric field values. As used herein, the term Units/meter (U/m) is used to designate a generic field unit. Also as used herein, the term "contiguous" is used to mean "overlapping" as well as "touching." It is to be further understood that it is also within the scope of the present invention to measure both the electric and magnetic components of the field, either simultaneously or sequentially. It is to be understood that the phrase "presenting the calibrated field data to a user" includes non-visual permanent or temporary existence in a register or a data storage device or sending the data to another program or file, as well as a visual display of the calibrated field data. As used herein, a "user" may be hardware, or software or a human.

The present invention is not to be limited to all of the details thereof as modifications and variations thereof may be made without departing from the spirit or scope of the invention.

What is claimed is:

1. A method of acquiring calibrated electromagnetic field data using a probe and readout comprising the steps of:
   a. acquiring electromagnetic field data using a multiple axis sensing probe;
   b. transmitting the field data in an uncalibrated form from the probe to a readout;
   c. calibrating the field data using a non-linear interpolation and linearization function by inserting predetermined values for coefficients into a curve-fitting equation previously used to calibrate a plurality of data points using a known field applied to the sensing probe; and
   d. presenting the calibrated field data to a user using the readout,
   wherein the field data is volts per meter (V/m) and the curve-fitting equation is of the form V/m=a+bx$^c$ where a, b, and c are the coefficients determined to linearize an uncalibrated data point "x" to provide calibrated volts per meter data.

2. The method of claim 1 wherein step c. further comprises using a plurality of sets of numerical values for the coefficients, where each set of numerical values corresponds to a separate segment using the curve-fitting equation.

3. The method of claim 1 wherein a separate set of numerical values for of the a, b, and c coefficients are used for each of a plurality of segments using the curve-fitting equation.

4. The method of claim 1 wherein the readout comprises a personal computer using Active X software technology to calibrate the data.

5. The method of claim 1 wherein the readout comprises a virtual readout using software on a personal computer.

6. The method of claim 1 wherein the readout comprises a rack mounted display.

7. The method of claim 1 wherein the readout comprises a hand held display.

8. The method of claim 1 wherein step c. further comprises preparing a look-up table of calibrated field data corresponding to every possible value of uncalibrated field data capable of being sent from the probe to the readout.

9. The method of claim 1 wherein the field data of step b further comprises a gain setting level and an analog to digital converter output reading.

10. The method of claim wherein the non-linear interpolation and linearization function comprises performing a segmented least squares curve fit to a predetermined equation.

11. The method of claim 10 wherein the predetermined equation comprises an expression of the form a+bx$^c$, where a, b, and c are the coefficients and x is an uncalibrated field data point.

12. The method of claim 11 wherein the least squares curve fit further comprises performing a Levenberg-Marquardt error minimization curve-fitting procedure.

13. The method of claim 1 wherein step c is performed on each individual data point as it is received by the readout.

14. The method of claim 1 wherein step c is performed after a plurality of data points are received by the readout.

* * * * *

UNITED STATES PATENT AND TRADEMARK OFFICE
CERTIFICATE OF CORRECTION

PATENT NO. : 6,564,158 B1
DATED : May 13, 2003
INVENTOR(S) : Jay A. Rabel et al.

It is certified that error appears in the above-identified patent and that said Letters Patent is hereby corrected as shown below:

<u>Column 26,</u>
Line 46, insert the number -- 1 -- after the word "claim".

Signed and Sealed this

Sixteenth Day of September, 2003

JAMES E. ROGAN
*Director of the United States Patent and Trademark Office*